United States Patent
Ghosh et al.

(10) Patent No.: US 11,092,646 B1
(45) Date of Patent: Aug. 17, 2021

(54) DETERMINING A VOLTAGE AND/OR FREQUENCY FOR A PERFORMANCE MODE

(71) Applicant: QUALCOMM Incorporated, San Diego, CA (US)

(72) Inventors: Sonia Ghosh, San Diego, CA (US); Changho Jung, San Diego, CA (US); Chulmin Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/794,105

(22) Filed: Feb. 18, 2020

(51) Int. Cl.
*G01R 31/3181* (2006.01)
*G01R 31/317* (2006.01)
*G01J 1/18* (2006.01)

(52) U.S. Cl.
CPC .......... *G01R 31/3181* (2013.01); *G01J 1/18* (2013.01); *G01R 31/31727* (2013.01)

(58) Field of Classification Search
CPC .. G01R 31/3181; G01R 31/31727; G01J 1/18
USPC .................... 714/738, 742, 745
See application file for complete search history.

(56) References Cited

U.S. PATENT DOCUMENTS

| | | | | |
|---|---|---|---|---|
| 4,137,522 A * | 1/1979 | Stein | ................ | G08C 15/12 340/4.21 |
| 4,534,007 A * | 8/1985 | Rhyner | ............. | G01D 5/244 33/1 M |
| 6,154,414 A * | 11/2000 | Lee | ................ | G11C 8/12 365/230.03 |
| 6,397,241 B1 * | 5/2002 | Glaser | ................ | G06F 7/722 708/625 |
| 6,507,609 B1 * | 1/2003 | Haubursin | ............. | G06F 13/24 375/220 |
| 6,667,645 B1 * | 12/2003 | Fletcher | ............... | G06F 1/10 327/200 |
| 8,248,136 B1 * | 8/2012 | Zhang | ................ | H03K 5/131 327/277 |
| 9,130,735 B2 * | 9/2015 | Lee | ................ | G06F 13/4295 |
| 9,490,785 B1 * | 11/2016 | Sridhar | .............. | H03K 3/0315 |
| 10,936,774 B1 * | 3/2021 | Katzir | ............... | G06F 30/3323 |
| 2005/0102125 A1 * | 5/2005 | Tseng | ................ | G06F 13/22 703/14 |
| 2006/0028888 A1 * | 2/2006 | Shin | ................ | G11C 11/4091 365/205 |
| 2007/0153619 A1 * | 7/2007 | Choo | ................ | G11C 7/1072 365/230.06 |
| 2010/0262877 A1 * | 10/2010 | Narayan | ........ | G01R 31/318572 714/727 |
| 2012/0139590 A1 * | 6/2012 | Myers | ................ | G06F 1/3237 327/113 |

(Continued)

*Primary Examiner* — John J Tabone, Jr.
(74) *Attorney, Agent, or Firm* — Chui-kiu Teresa Wong

(57) ABSTRACT

According to certain aspects, a method includes receiving an input test signal at a test input, receiving an event signal, and passing the input test signal to a test output or blocking the input test signal from the test output based on the event signal. In certain aspects, the event signal indicates an occurrence of an event in a circuit block (e.g., a memory, a processor, or another type of circuit block). The event may include a precharge operation, opening of input latches, reset of a self-time loop, arrival of a data value at a flop in a signal path, an interrupt signal indicating an error or failure in the circuit block, or another type of event.

10 Claims, 13 Drawing Sheets

(56) References Cited

U.S. PATENT DOCUMENTS

| | | | |
|---|---|---|---|
| 2014/0359385 A1* | 12/2014 | Shah | G01R 31/3177 |
| | | | 714/726 |
| 2015/0023454 A1* | 1/2015 | Lee | H04L 7/033 |
| | | | 375/342 |
| 2016/0124043 A1* | 5/2016 | Datta | G11C 7/1057 |
| | | | 714/731 |

* cited by examiner

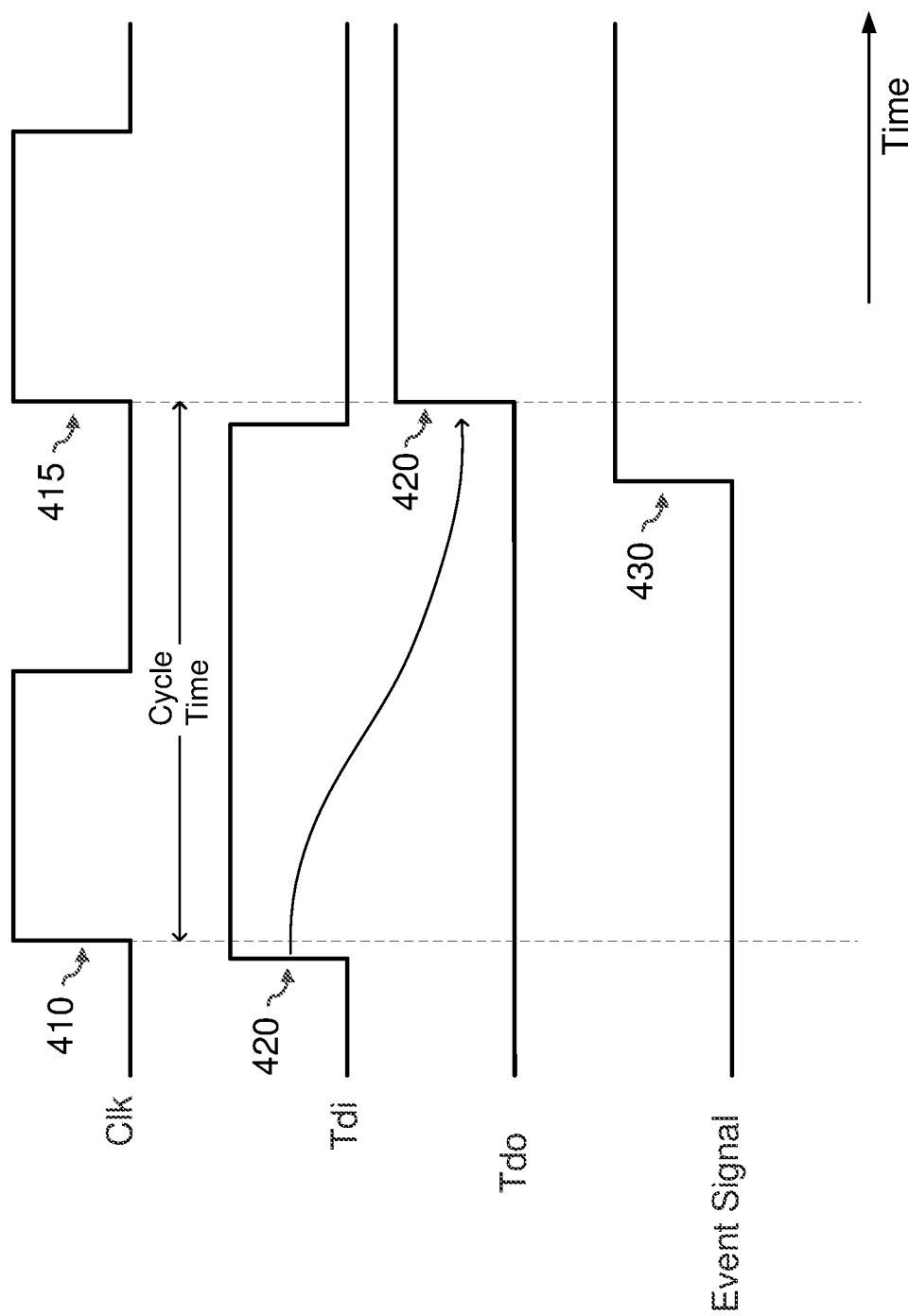

DETERMINING A VOLTAGE AND/OR FREQUENCY FOR A PERFORMANCE MODE

BACKGROUND

Field

Aspects of the present disclosure relate generally to dynamic frequency and voltage scaling, and more particularly, to determining a voltage and/or frequency for a performance mode.

Background

A system (e.g., a system on a chip (SoC)) may employ dynamic frequency and voltage scaling in which a controller dynamically scales a voltage (e.g., a supply voltage) and a frequency (e.g., a clock frequency) of a circuit block in the system based on a desired performance mode for the circuit block. In this regard, the system may support multiple performance modes for the circuit block with each performance mode having a respective frequency and voltage. The controller may select one of the performance modes for the circuit block (e.g., based on a performance requirement for the circuit block), and set the voltage and frequency of the circuit block based on the selected performance mode.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a first flop having a data input, a clock input, and an output, wherein the clock input of the first flop is configured to receive a clock signal. The apparatus also includes a blocking gate having a signal input, a control input, and an output, wherein the signal input is coupled to the output of the first flop. The apparatus further includes a second flop having a data input, a clock input, and an output, wherein the data input of the second flop is coupled to the output of the blocking gate, and the clock input of the second flop is configured to receive the clock signal. The blocking gate is configured to receive an event signal at the control input, and couple the output of the first flop to the data input of the second flop or block the output of the first flop from the data input of the second flop based on the event signal.

A second aspect relates to a method. The method includes receiving an input test signal at a test input, receiving an event signal, and passing the input test signal to a test output or blocking the input test signal from the test output based on the event signal.

BRIEF DESCRIPTION OF THE DRAWINGS

FIG. 4A is a timing diagram illustrating an example of signals used to determine a voltage for a performance mode according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
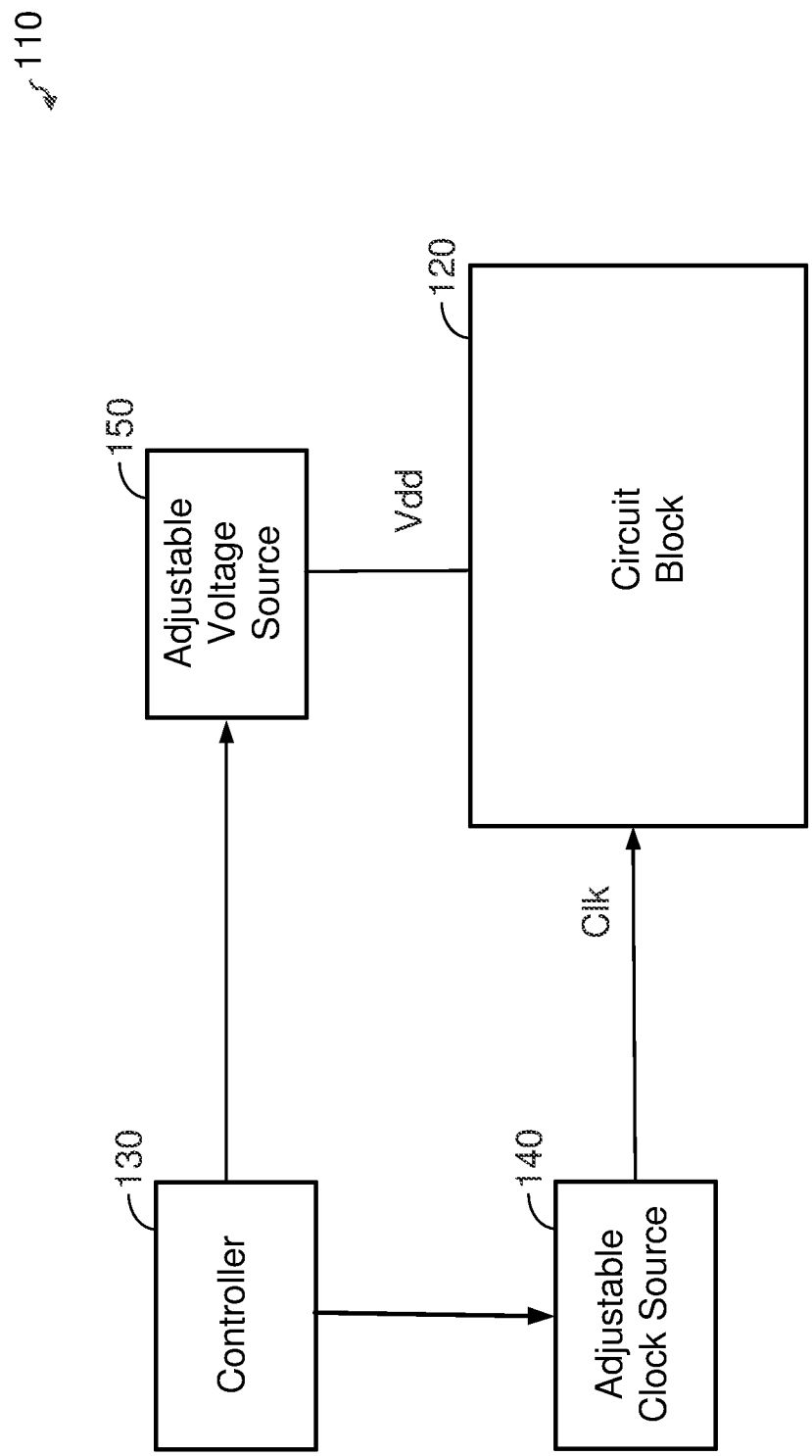
FIG. 1 shows an example of a system employing dynamic frequency and voltage scaling according to certain aspects of the present disclosure.

A system (e.g., a system on a chip (SoC)) may employ dynamic frequency and voltage scaling in which a controller dynamically scales a voltage (e.g., a supply voltage) and a frequency (e.g., a clock frequency) of a circuit block (e.g., a memory, a processor, etc.) in the system based on a desired performance mode for the circuit block. In this regard, FIG. 1 shows an example of a system 110 employing dynamic frequency and voltage scaling (DFVS) for managing performance and power. DFVS may also be referred to as dynamic clock voltage scaling (DCVS), adaptive voltage scaling, or another term.

In this example, the system 110 includes a circuit block 120, a controller 130, an adjustable clock source 140, and an adjustable voltage source 150. The circuit block 120 may include a memory (e.g., a dynamic random-access memory (DRAM), a static random-access memory (SRAM), etc.), a processor (e.g., a central processing unit (CPU), a graphics processing unit (GPU), etc.), and/or another type of circuit block. The circuit block 120 may also be referred to as a functional block, a subsystem, or another term.

The adjustable clock source 140 is coupled to the circuit block 120 and is configured to provide the circuit block 120 with a clock signal Clk for timing operations of the circuit block 120. The frequency of the clock signal Clk is adjustable, as discussed further below. The adjustable clock source 140 may be implemented with a phase-locked loop (PLL), or another type of clock source.

The adjustable voltage source 150 is coupled to the circuit block 120 and is configured to provide the circuit block 120 with a supply voltage Vdd for powering the circuit block 120. The supply voltage Vdd is adjustable, as discussed further below. The adjustable voltage source 150 may be implemented with a switching voltage regulator, a linear voltage regulator, or a combination of both.

The controller 130 is coupled to the adjustable clock source 140 and the adjustable voltage source 150. The controller 130 is configured to set the clock frequency of the adjustable clock source 140 (i.e., the frequency of the clock signal Clk) and the supply voltage Vdd of the adjustable voltage source 150 based on a desired performance mode for the circuit block 120. In this regard, the controller 130 may support multiple performance modes for the circuit block 120 with each performance mode having a respective clock frequency and supply voltage (i.e., frequency-voltage pair). In this example, the controller 130 may select one of the performance modes for the circuit block 120 (e.g., based on a performance requirement for the circuit block 120), and set the supply voltage Vdd of the adjustable voltage source 150 and the clock frequency of the adjustable clock source 140 based on the selected performance mode. The performance requirement for the circuit block 120 may be based on a desired data throughput, latency, quality of service, and/or another parameter. For a use case with a low performance requirement, the controller 130 may select a low performance mode to conserve power. For a use case with a high-performance requirement, the controller 130 may select a high performance mode to increase the performance of the circuit block 120.

Thus, the controller 130 may operate the circuit block 120 in one of multiple performance modes. In one example, each of the performance modes has a respective frequency (e.g., clock frequency) corresponding to a respective level of performance In this example, a performance mode with a higher frequency generally has a higher level of performance than a performance mode with a lower frequency. The higher frequency may increase performance by increasing data throughput, increasing processing speed, reducing latency, etc.

Each of the performance modes also has a respective voltage (e.g., supply voltage Vdd) corresponding to the respective frequency. For each of the performance modes, the respective voltage allows the circuit block 120 to operate at the respective frequency. A performance mode with a higher frequency generally has a higher voltage than a performance mode with a lower frequency. This is because, for a higher frequency, the voltage of the circuit block 120 may need to be increased in order to increase the switching speeds of transistors in the circuit block 120 to enable the circuit block 120 to operate at the higher frequency. In certain aspects, the voltage for a performance mode may be a minimum voltage needed to operate the circuit block 120 at the frequency of the performance mode. In one example, the controller 130 may set the voltage (e.g., supply voltage Vdd) of the adjustable voltage source 150 to any one of multiple selectable voltages. In this example, the voltage for a performance mode may correspond to the minimum one of the selectable voltages that allows the circuit block 120 to operate at the frequency of the performance mode.

Thus, each of the performance modes has a respective frequency (e.g., clock frequency) and voltage (e.g., supply voltage Vdd). In one example, the controller 130 may include a lookup table stored in memory, in which the lookup table includes the frequency and voltage (i.e., frequency-voltage pair) for each of the performance modes. In this example, the controller 130 may select one of the performance modes (e.g., based on a performance requirement for the circuit block 120), retrieve the frequency and voltage for the selected performance mode from the lookup table, and set the clock frequency of the adjustable clock source 140 and the supply voltage Vdd of the adjustable voltage source 150 based on the retrieved frequency and voltage, respectively.

As discussed above, each of the performance modes has a respective frequency corresponding to a respective level of performance and a respective voltage that allows the circuit block 120 to operate at the respective frequency. The voltage for a particular performance mode (and hence frequency) may vary from chip to chip due to process variations. For example, a chip with a fast-fast (FF) process corner may enable the circuit block 120 to operate at a given frequency with a lower voltage than a chip with a slow-slow (SS) process corner. Thus, the voltage for a particular performance mode (and hence frequency) may be process dependent.

Figure 2:
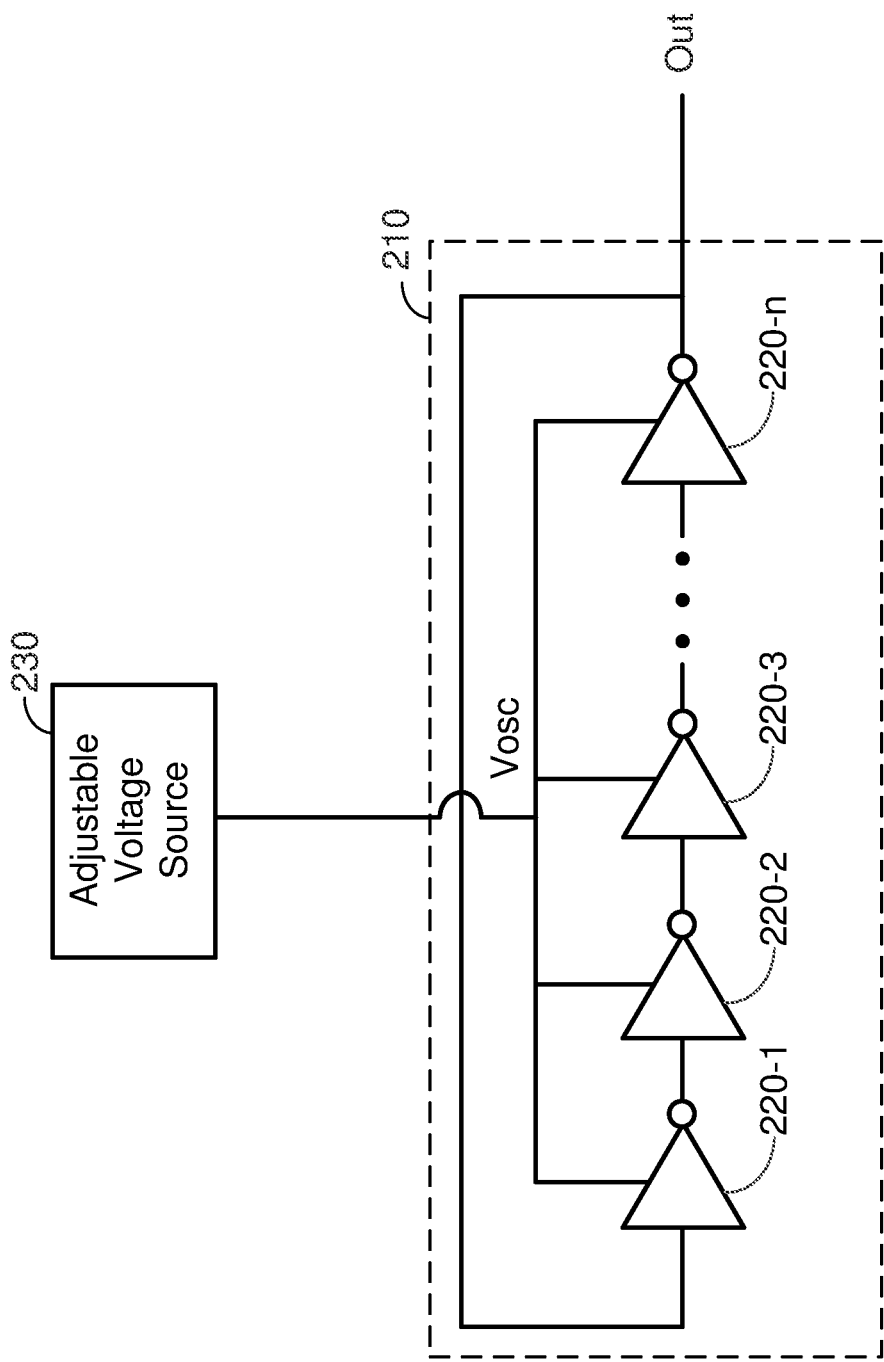
FIG. 2 shows an example of a ring oscillator used to determine a voltage for a performance mode.

One approach for determining the voltage for a performance mode (and hence frequency) uses a ring oscillator to take into account process variation. In this regard, FIG. 2 shows an example of a ring oscillator 210 that may be used to determine the voltage for a performance mode. The ring oscillator 210 is integrated on the same chip as the circuit block 120 (shown in FIG. 1), and is therefore subject to the same or substantially the same process conditions as the circuit block 120.

In this example, the ring oscillator 210 includes multiple inverters 220-1 to 220-n coupled in series, in which the output of the last inverter 220-n is coupled to the input of the first inverter 220-1 to form a loop that oscillates at an oscillation frequency. An adjustable voltage source 230 is coupled to the inverters 220-1 to 220-n and is configured to provide an adjustable voltage Vosc to the inverters 220-1 to 220-n. The voltage Vosc controls the delay of each inverter 220-1 to 220-n, which, in turn, controls the oscillation frequency of the ring oscillator 210. The higher the voltage Vosc, the shorter the delay of each inverter 220-1 to 220-n, and the higher the oscillation frequency. The adjustable voltage source 230 may be the same as the adjustable voltage source 150 shown in FIG. 1 or different.

The voltage Vosc needed to achieve a given oscillation frequency is process dependent. For example, a chip with a fast-fast (FF) process corner may require a lower voltage Vosc to achieve a given oscillation frequency than a chip with a slow-slow (SS) process corner. Because the ring oscillator 210 is integrated on the same chip as the circuit block 120 and is therefore subject to the same or substantially the same process conditions as the circuit block 120, the voltage-frequency characteristics of the ring oscillator 210 may be measured and used to determine a voltage (e.g., a minimum voltage) that meets the frequency of a given performance mode (i.e., a voltage that allows the circuit block 120 to operate at the frequency).

A drawback of the above approach is that the ring oscillator 210 may not provide an accurate indication of the voltage needed to operate the circuit block 120 at the frequency of a given performance mode. This is because the structure of the ring oscillator 210 differs from the structure of the circuit block 120, and therefore may not provide a good representation of the circuit block 120. For example, the circuit block 120 may include a combination of logic and metal interconnects that affect the voltage needed to operate the circuit block 120 at a given frequency, but which are not reflected in the ring oscillator 210.

As a result, the voltage determined for a performance mode using the ring oscillator 210 may not be accurate. To compensate for this, a voltage margin may be added to the voltage determined for the performance mode using the ring oscillator 210. However, the voltage margin may be too large or too small. If the voltage margin is too large, then the voltage for the performance mode may be much larger than needed to operate the circuit block 120 at the frequency of the performance mode, resulting in a large amount of excess power consumption. The excess power consumption may significantly reduce the battery life of a mobile device incorporating the circuit block 120. If the voltage margin is too small, then the circuit block 120 may malfunction.

In another approach, a full functional test may be performed on the circuit block 120 at different voltages for a given frequency to determine a voltage for the corresponding performance mode. However, performing a full functional test on the circuit block 120 may be time consuming and expensive in terms of resources.

Aspects of the present disclosure provide a circuit that utilizes a signal generated by the circuit block 120 to determine a voltage (e.g., a minimum voltage) that meets the frequency of a given performance mode. Because the signal is generated by the circuit block 120, the signal allows the circuit to accurately track the effects that the structure of the circuit block 120 has on the voltage needed to operate the circuit block 120 at the frequency of the performance mode. This allows the circuit to more accurately determine a voltage (e.g., a minimum voltage) that meets the frequency of the performance mode compared with a ring oscillator (which does not match the structure of the circuit block 120). In addition, the circuit does not require a full functional test to determine the voltage that meets the frequency of the performance mode, thereby avoiding the large amount of resources and time needed for a full functional test.

Figure 3:
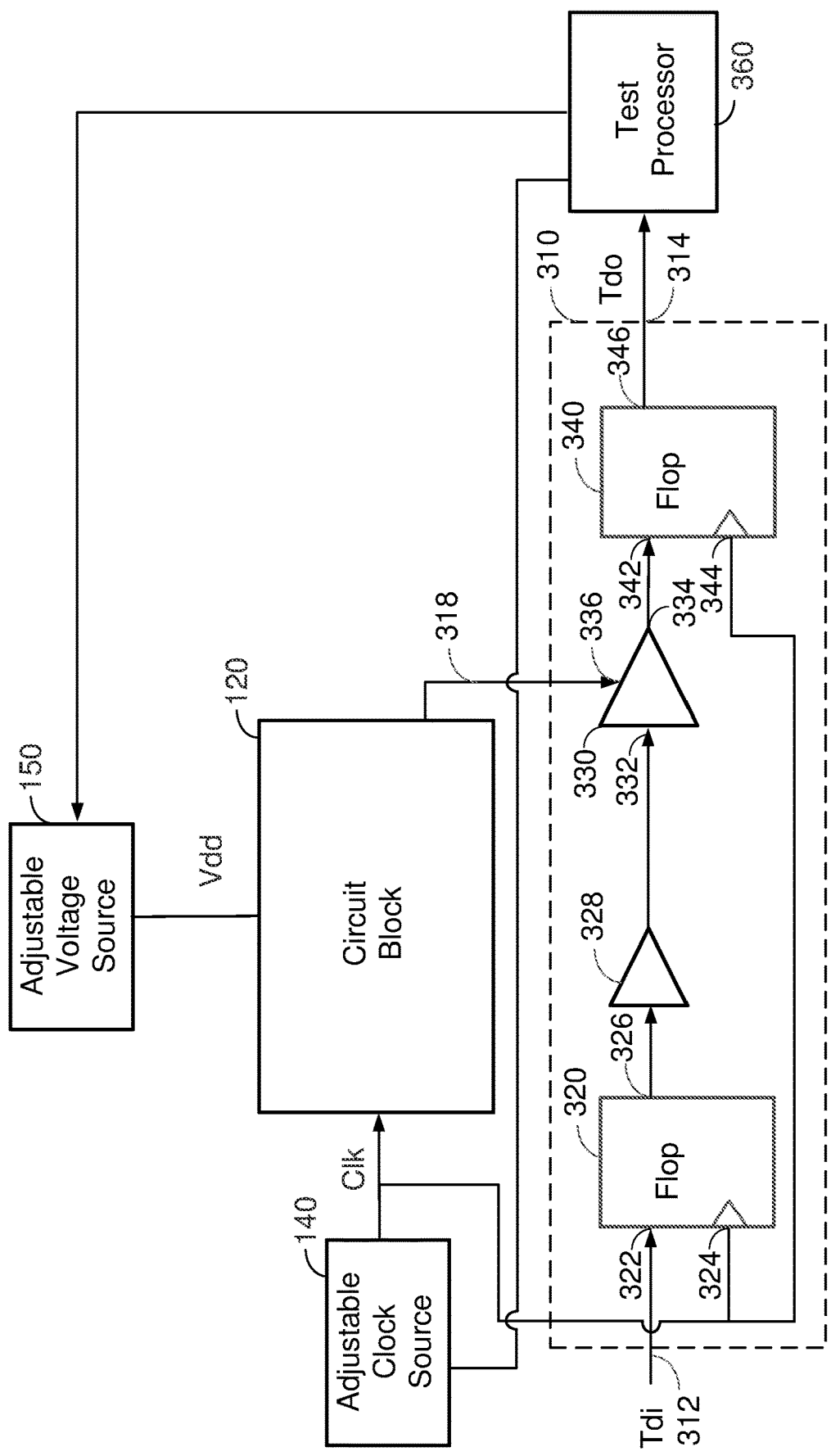
FIG. 3 shows an example of a circuit for determining a voltage and/or a frequency for a performance mode according to certain aspects of the present disclosure.

FIG. 3 shows an example of a circuit 310 for determining a voltage (e.g., a minimum voltage) that meets the frequency of a performance mode according to aspects of the present disclosure. As discussed further below, the circuit 310 uses an event signal 318 generated by the circuit block 120 to determine a voltage (e.g., a minimum voltage) that meets the frequency of the performance mode. The event signal 318 allows the circuit 310 to more accurately determine a voltage that meets the frequency of the performance mode compared with a ring oscillator without the need for a full functional test of the circuit block 120.

In certain aspects, the event signal 318 indicates the occurrence of an event at the circuit block 120, in which the event may need to occur within a cycle time in order for the circuit block 120 to function properly. In one example, the event may be the completion of an operation by the circuit block 120 before the end of the cycle time. In another example, the event may be the arrival of a signal at a device (e.g., a flop) in a signal path of the circuit block 120 before the end of the cycle time. In this example, the signal may need to propagate to the device before the end of the cycle time in order to avoid a timing violation in the circuit block 120 and/or another type of failure. Additional examples for the event are discussed further below. In one example, the cycle time may correspond to one or more cycles (i.e., periods) of the clock signal Clk. Thus, in this example, the cycle time depends on the frequency (e.g., clock frequency) of the current performance mode. The higher the frequency, the shorter the cycle time, and, the lower the frequency, the longer the cycle time.

In this example, the circuit block 120 may fail to function properly if the event does not occur before the end of the current cycle time. The time at which the event occurs depends on the supply voltage Vdd to the circuit block 120. For the example in which the event is completion of an operation, the time that it takes for the circuit block 120 to complete the operation may depend on the supply voltage Vdd. In this example, the circuit block 120 may be able to complete the operation faster for a higher supply voltage Vdd than a lower supply voltage Vdd. Thus, whether the circuit block 120 completes the operation by the end of the current cycle time depends on the supply voltage Vdd.

For the example in which the event is the arrival of a signal at a device (e.g., flop) in a signal path of the circuit block 120, the time it takes for the signal to reach the device may depend on the propagation delay of the signal in the path, which, in turn, depends on the supply voltage Vdd. In this example, the propagation delay of the signal in the path may be shorter for a higher supply voltage Vdd than a lower supply voltage Vdd. As a result, the signal reaches the device in the path sooner for a higher supply voltage Vdd than a lower supply voltage Vdd. Thus, whether the signal arrives at the device in the path by the end of the current cycle time depends on the supply voltage Vdd.

The circuit 310 uses the event signal 318 from the circuit block 120 to determine a voltage (e.g., minimum voltage) that allows the circuit block 120 to operate at the frequency of a performance mode, as discussed further below.

In the example in FIG. 3, the circuit 310 includes a first flop 320, a buffer 328, a blocking gate 330, and a second flop 340.

The first flop 320 has a data input 322, a clock input 324, and an output 326. In one example, the clock input 324 receives the clock signal Clk. In this example, the first flop 320 is configured to latch the logic value at the data input 322 on a rising edge of the clock signal Clk, and output the latched logic value at the output 326. In the example shown in FIG. 3, the data input 322 of the first flop 320 is coupled to an input 312 of the circuit 310, which receives an input test signal (labeled "Tdi").

The blocking gate 330 has a signal input 332, a control input 336, and an output 334. The signal input 332 is coupled to the output 326 of the first flop 320 via the buffer 328. The buffer 328 may be omitted in some implementations. The control input 336 receives the event signal 318 from the circuit block 120, and the output 334 is coupled to the second flop 340.

The blocking gate 330 is configured to block the signal at the signal input 332 or pass the signal at the signal input 332 to the output 334 based on the event signal 318 received at the control input 336, as discussed further below. The blocking gate 330 may be implemented with a tristate inverter, a pass gate (e.g., a transmission gate), a multiplexer, or another circuit (e.g., logic) configured to controllably block or pass a signal (e.g., the input test signal Tdi).

The second flop 340 has a data input 342, a clock input 344, and an output 346. In one example, the clock input 344 receives the clock signal Clk. In this example, the second flop 340 is configured to latch the logic value at the data input 342 on a rising edge of the clock signal Clk, and output the latched logic value at the output 346. In the example shown in FIG. 3, the data input 342 of the second flop 340 is coupled to the output 334 of the blocking gate 330. The output 346 of the second flop 340 is coupled to an output 314 of the circuit 310, and outputs an output test signal (labeled "Tdo") to the output 314 of the circuit 310. The output 314 of the circuit 310 may be coupled to a test processor 360.

When the blocking gate 330 is enabled by the event signal 318, the blocking gate 330 blocks the output 326 of the first flop 320 from the data input 342 of the second flop 340, which prevents the signal from the first flop 320 from propagating to the second flop 340. When the blocking gate 330 is disabled, the blocking gate 330 couples the output 326 of the first flop 320 to the data input 342 of the second flop 340, which allows the signal from the first flop 320 to pass to the second flop 340. In one example, the blocking gate 330 is disabled (i.e., couples the output 326 of the first flop 320 to the data input 342 of the second flop 340) when the event signal 318 indicates occurrence of the event discussed above, and is enabled (i.e., blocks the output 326 of the first flop 320 from the data input 342 of the second flop 340) when the event signal 318 does not indicate occurrence of the event. In this example, the event signal 318 may have a first logic value (e.g., one) to indicate occurrence of the event, and a second logic value (e.g., zero) when the event has not occurred.

Exemplary operations of the circuit 310 will now be discussed below according to certain aspects with reference to FIGS. 4A and 4B. The exemplary operations discussed below may be performed to determine a voltage (e.g., a minimum voltage) that meets the frequency of a given performance mode. In this example, the test processor 360 may set the clock frequency of the adjustable clock source 140 to the frequency of the performance mode. The test processor 360 may then sequentially set the supply voltage Vdd of the adjustable voltage source 150 to each one of multiple voltages for testing. For each of the voltages being tested, the test processor 360 may determine whether the circuit block 120 is able to operate at the frequency of the performance mode based on the output test signal Tdo from the circuit 310, as discussed further below. In one example, the test processor 360 may select the minimum one of the voltages that allows the circuit block 120 to operate at the frequency of the performance mode. In this example, the minimum voltage may allow the circuit block 120 to operate at the frequency of the performance mode while using a least amount of power to operate at the frequency for improved power efficiency.

FIG. 4A shows an example of the clock signal Clk, the input test signal Tdi, the output test signal Tdo, and the event signal 318 from the circuit block 120 for one of the voltages being tested. Note that the cycle time is fixed for a particular frequency (e.g., clock frequency). In the example shown in FIG. 4A, the input test signal Tdi includes an edge 420. In this example, the edge 420 is a rising edge corresponding to a transition from a logic value of zero to a logic value of one. On the rising edge 410 of the clock signal Clk at the start of the cycle time, the first flop 320 latches the edge 420 of the input test signal Tdi, and outputs the latched edge 420 at the output 326 of the first flop 320.

The event signal 318 from the circuit block 120 includes an edge 430. In this example, the edge 430 is a rising edge and the event signal 318 has a logic value of one when the event occurs. Thus, in this example, the edge 430 of the event signal 318 indicates occurrence of the event. In the example in FIG. 4A, the edge 430 occurs before the end of the cycle time, indicating occurrence of the event before the end of the cycle time. The blocking gate 330 is disabled on the edge 430 of the event signal 318, and therefore passes the edge 420 of the input test signal Tdi to the data input 342 of the second flop 340.

On the rising edge 415 of the clock signal Clk at the end of the cycle time, the second flop 340 latches the logic value at the data input 342 of the second flop 340. Since the blocking gate 330 is disabled before the end of the cycle time in this example, the blocking gate 330 passes the edge 420 of the input test signal Tdi to the data input 342 of the second flop 340. As a result, the second flop 340 latches the edge 420 of the input test signal Tdi, and outputs the latched edge 420. Thus, in this example, the output test signal Tdi includes the edge 420 from the input test signal Tdi, and therefore reflects the input test signal Tdi. In other words, the edge 420 of the input test signal Tdi propagates to the output 314 of the circuit 310.

The test processor 360 determines whether the circuit block 120 is able to operate at the frequency of the performance mode based on whether the input test signal Tdi is reflected in the output test signal Tdo. In the example in FIG. 4A, the output test signal Tdo reflects the input test signal Tdi (i.e., the output test signal Tdo includes the edge 420). Therefore, the test processor 360 determines that the circuit block 120 is able to operate at the frequency of the performance mode for the voltage tested in FIG. 4A. In this example, the input test signal Tdi may be predefined and known by the test processor 360. This allows the test processor 360 to determine whether the input test signal Tdi is reflected in the output test signal Tdo.

Figure 4B:
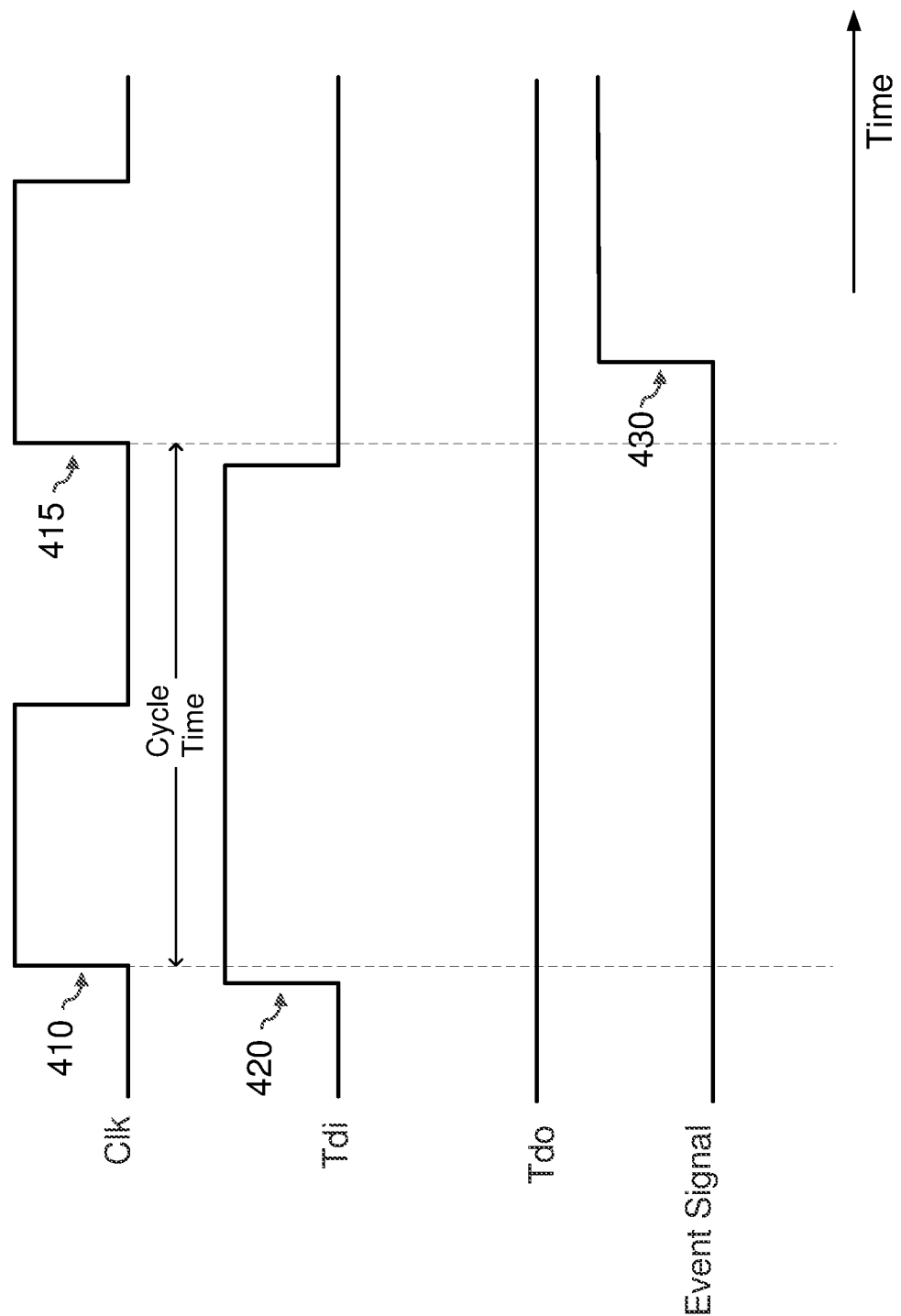
FIG. 4B is a timing diagram illustrating another example of signals used to determine a voltage for a performance mode according to certain aspects of the present disclosure.

FIG. 4B shows another example of the clock signal Clk, the input test signal Tdi, the output test signal Tdo, and the event signal 318 for another voltage being tested. The frequency in FIG. 4B is the same as the frequency in FIG. 4A, and thus the cycle time is the same. However, the voltage (e.g., supply voltage Vdd) is lower in FIG. 4B than the voltage in FIG. 4A. The lower voltage increases the time it takes for the event to occur, which causes the edge 430 of the event signal 318 to shift to the right relative to the position of the edge 430 in FIG. 4A.

In the example shown in FIG. 4B, the edge 430 of the event signal 318 arrives after the end of the cycle time. As a result, the blocking gate 330 is not disabled before the end of the cycle time, and therefore blocks the edge 420 of the input test signal Tdi from the data input 342 of the second flop 340. Consequently, the second flop 340 does not latch the edge 420 of the input test signal Tdi on the rising edge 415 of the clock signal Clk at the end of the cycle time, and the output test signal Tdo does not reflect the input test signal Tdi. In other words, the blocking gate 330 is still enabled at the end of the cycle time and blocks the edge 420 of the input test signal Tdi from propagating to the output 314 of the circuit 310.

In the example in FIG. 4B, the output test signal Tdo does not reflect the input test signal Tdi. Therefore, the test processor 360 determines that the circuit block 120 fails to operate properly at the frequency of the performance mode for the voltage tested in FIG. 4B.

Thus, FIGS. 4A and 4B show examples of the clock signal Clk, the input test signal Tdi, the output test signal Tdo, and the event signal 318 from the circuit block 120 for two different voltages (e.g., supply voltages Vdd) at the same frequency. In the example in FIG. 4A, the output test signal Tdo reflects the input test signal Tdi, indicating that the circuit block 120 is able to operate at the frequency for the voltage tested in FIG. 4A. Thus, the voltage tested in FIG. 4A is a candidate for use in the corresponding performance mode. In the example in FIG. 4B, the output test signal Tdo does not reflect the input test signal Tdi, indicating that the circuit block 120 fails to operate properly at the frequency for the voltage tested in FIG. 4B. In other words, the voltage tested in FIG. 4B is too low for the circuit block 120 to operate at the frequency.

The test processor 360 may perform the exemplary operations discussed above to determine a voltage (e.g., a minimum voltage) that meets the frequency of a given performance mode. In this example, the test processor 360 may set the clock frequency of the adjustable clock source 140 to the frequency of the performance mode. The test processor 360 may then sequentially set the supply voltage Vdd of the adjustable voltage source 150 to each of the multiple voltages being tested for the performance mode.

For each of the voltages being tested for the performance mode, the test processor 360 determines whether the output test signal Tdo reflects the input test signal Tdi (i.e., the input test signal Tdi propagates to the output 314 of the circuit 310). If the output test signal Tdo reflects the input test signal Tdi, then the test processor 360 determines that the circuit block 120 is able to operate at the frequency of the performance mode for the tested voltage. If the output test signal Tdo does not reflect the input test signal, then the test processor 360 determines that the circuit block 120 fails to operate properly at the frequency of the performance mode for the tested voltage.

In one example, the test processor 360 may select the minimum one of the voltages being tested that allows the circuit block 120 to operate at the frequency of the performance mode (i.e., the minimum one of the voltages for which the output test signal Tdo reflects the input test signal Tdi). In this example, the minimum voltage may allow the circuit block 120 to operate at the frequency of the performance mode using a least amount of power for improved power efficiency.

The test processor 360 may repeat the above procedure for each one of multiple performance modes to determine a voltage for each one of the performance modes. The determined voltage for each performance mode may be stored in the lookup table discussed above for later use by the controller 130.

The example in each of FIGS. 4A and 4B shows one cycle time. However, it is to be appreciated that a voltage may be tested over multiple cycle times to determine whether the circuit block 120 is able to operate at a particular frequency for the tested voltage. In this example, the input test signal Tdi may include a pattern of bits (e.g., sequence of bits) in which each bit corresponds to one of the cycle times. Also, for each of the cycle times, the event signal 318 may indicate whether the event occurs within the cycle time. The cycle times may be consecutive or non-consecutive.

During each of the cycle times, the blocking gate 330 either passes or blocks the corresponding bit of the input test signal Tdi based on the event signal 318. If the event signal 318 indicates occurrence of the event before the end of the cycle time, then the blocking gate 330 passes the bit to the second flop 340. In this case, the bit propagates to the output 314 of the circuit 310. If the event signal 318 does not indicate occurrence of the event before the end of the cycle time, then the blocking gate 330 blocks the bit.

After the last cycle time, the test processor 360 may compare the pattern of bits of the output test signal Tdo with the known pattern of bits of the input test signal Tdi. If the pattern of bits of the output test signal Tdi matches the pattern of bits of the input test signal Tdi (i.e., the output test signal Tdo reflects the input test signal Tdi), then the test processor 360 may determine that the circuit block 120 is able to operate at the frequency for the tested voltage. If the pattern of bits of the output test signal Tdi does not match the pattern of bits of the input test signal Tdi (i.e., the output test signal Tdo does not reflect the input test signal Tdi), then the test processor 360 may determine that the circuit block 120 is not able to operate at the frequency for the tested voltage. The above exemplary operations may be repeated for each voltage being tested at the frequency.

In the above examples, the circuit 310 is used to determine a voltage for a given frequency (e.g., a minimum voltage that allows the circuit block 120 to operate at the given frequency). However, it is to be appreciated that the circuit 310 is not limited to the above examples.

For example, the circuit 310 may also be used to determine a frequency for a given voltage. In this example, the test processor 360 may set the supply voltage of the adjustable voltage source 150 to the given voltage. The test processor 360 may then sequentially set the clock frequency of the adjustable clock source 140 to each one of multiple frequencies for testing. For each frequency being tested, the test processor 360 determines whether the circuit block 120 is able to operate at the frequency being tested for the given voltage. For example, the test processor 360 may determine that the circuit block 120 is able to operate at a frequency being tested if the output test signal Tdo reflects the input test signal Tdi, and determine that the circuit block 120 fails to operate at a frequency being test if the output test signal Tdo does not reflect the input test signal Tdi. After testing each of the multiple frequencies for the given voltage, the test processor 360 may select the maximum one of the frequencies for which the circuit block 120 is able to operate at the given voltage. In this example, the maximum frequency may allow the circuit block 120 to achieve a maximum performance at the given voltage. The above procedure may be repeated for each one of multiple voltages to determine a frequency for each of the voltages. Thus, the circuit 310 may be used to determine a voltage for a given frequency and/or determine a frequency for a given voltage.

It is to be appreciated that the blocking gate 330 may be non-inverting or inverting. For implementations in which the blocking gate 330 is non-inverting, the blocking gate 330 does not invert the signal at the signal input 332 when passing the signal (e.g., input test signal Tdi) to the output 334. For implementations in which the blocking gate 330 is inverting, the blocking gate 330 inverts the signal at the signal input 332 when passing the signal to the output 334. In this case, the buffer 328 may also be inverting, which undoes the inverting by the blocking gate 330. Alternatively, the test processor 360 may take into account that the blocking gate 330 is inverting, and determine that the output test signal Tdo reflects the input test signal Tdi when the output test signal Tdo is the inverse of the input test signal Tdi.

As discussed above, the input test signal Tdi may be known by the test processor 360, allowing the test processor 360 to determine whether the input test signal Tdi is reflected in the output test signal Tdo. In one example, the test processor 360 may generate the input test signal Tdi and output the input test signal Tdi to the circuit 310, in which case the test processor 360 is coupled to the input 312 of the circuit 310. In another example, the input test signal Tdi may be provided by the circuit block 120, in which case the circuit block 120 is coupled to the input 312 of the circuit 310. In this example, the circuit block 120 may generate the input test signal Tdi in response to a known input stimulus (e.g., a known signal input to the circuit block 120). In this example, the input test signal Tdi is known by the test processor 360 assuming the response of the circuit block 120 to the input stimulus is also known. It is to be appreciated that the present disclosure is not limited to these examples, and that the input test signal Tdi may be generated by another circuit so long as the input test signal Tdi is known by the test processor 360.

Aspects of the present disclosure will now be discussed using an example in which the circuit block 120 includes a memory (e.g., a DRAM, an SRAM, or another type of memory). However, it is to be appreciated that the present disclosure is not limited to this example, and that aspects of the present disclosure may be applied to other types of circuit blocks such as a processor (e.g., a CPU, a GPU, etc.), a modem, a logic block, etc.

Figure 5:
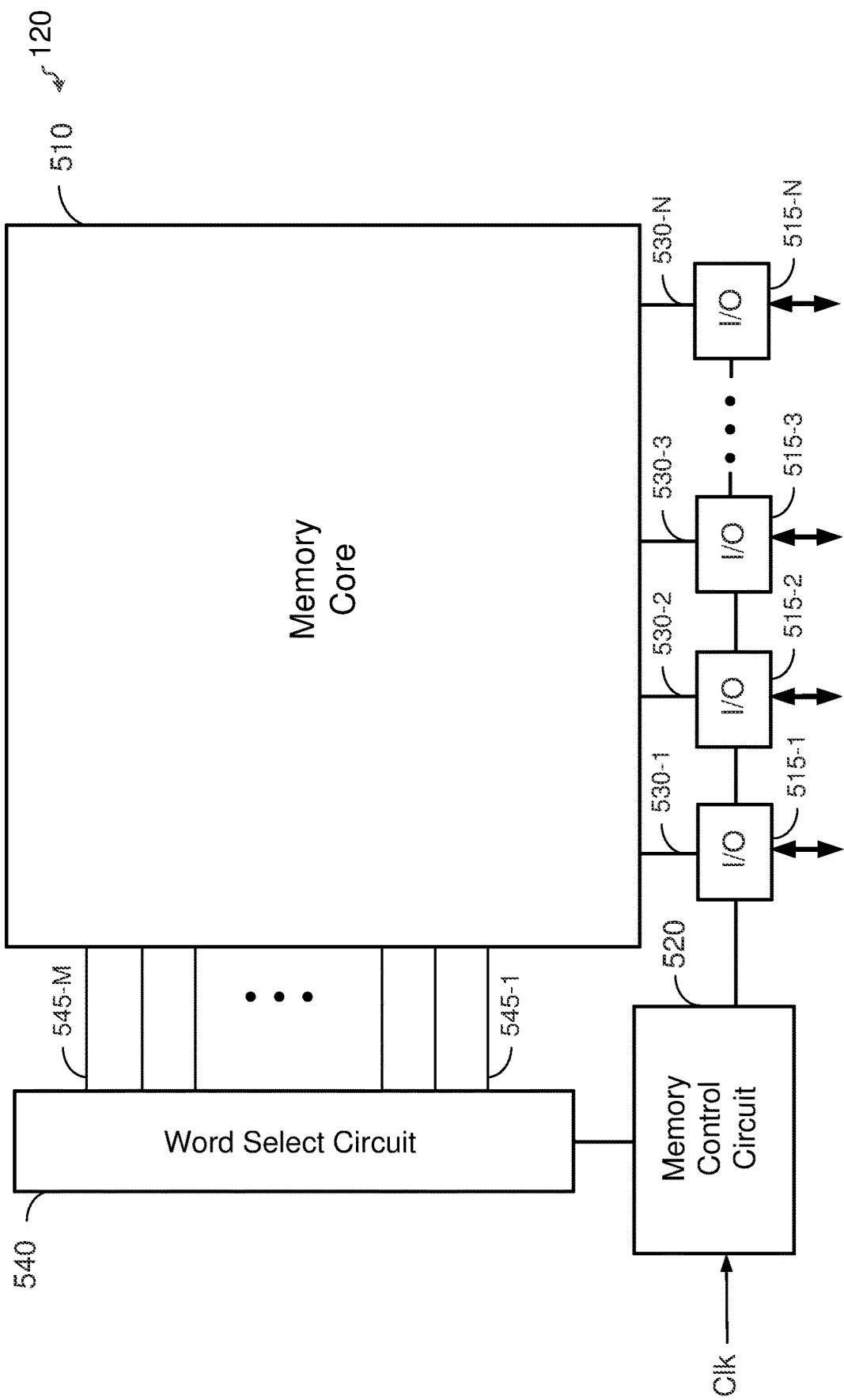
FIG. 5 shows an example of a memory according to aspects of the present disclosure.
Figure 6:
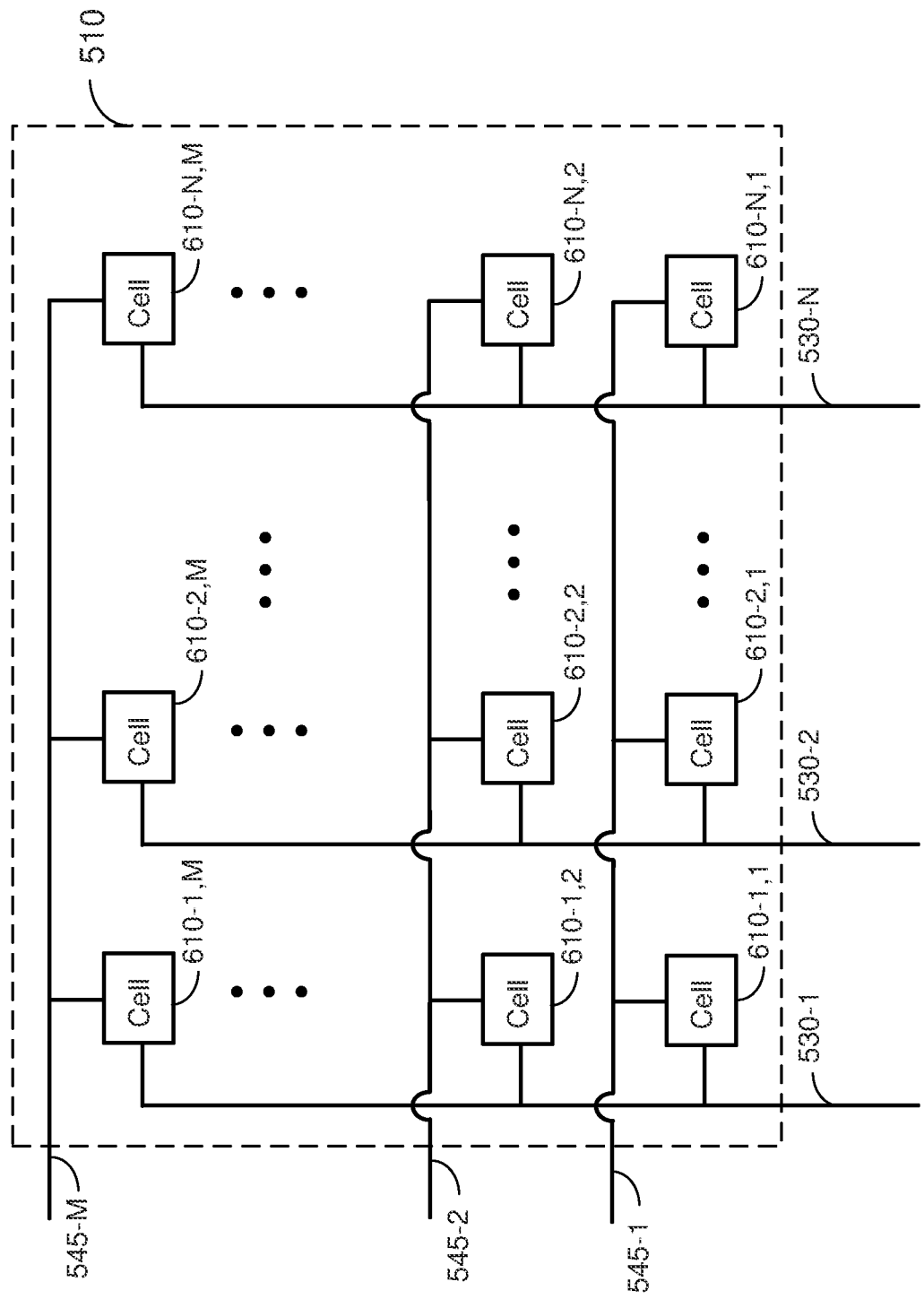
FIG. 6 shows an example of a memory core including an array of memory cells according to certain aspects of the present disclosure.

FIG. 5 shows an example in which the circuit block 120 includes a memory (e.g., a DRAM, an SRAM, or another type of memory) according to certain aspects. The memory includes a memory core 510, a memory control circuit 520, a word select circuit 540, and multiple input/output (I/O) circuits 515-1 to 515-N. Referring to FIG. 6, the memory core 510 includes an array of memory cells 610-1,1 to 610-N,M, where each memory cell is configured to store a bit. In one example, each of the memory cells 610-1,1 to 610-N,M may include a respective storage capacitor (not shown), in which the amount of charge stored on the respective storage capacitor indicates whether the memory cell stores a one or a zero. In another example, each of the memory cells 610-1,1 to 610-N,M may include respective cross-coupled inverters. In the example shown in FIG. 6, the memory core 510 includes bit lines 530-1 to 530-N and word lines 545-1 to 545-M. Each of the bit lines 530-1 to 530-N is coupled to a respective column of memory cells, and each of the word lines 545-1 to 545-M is coupled to a respective row of memory cells. Referring back to FIG. 5, each of the bit lines 530-1 to 530-N is coupled to a respective one of the I/O circuits 515-1 to 515-N, and the word lines 545-1 to 545-M are coupled to the word select circuit 540.

The word select circuit 540 is configured to select one of the word lines 545-1 to 545-M under the control of the memory control circuit 520, as discussed further below. Each of the I/O circuits 515-1 to 515-N is configured to read a bit from a selected one of the memory cells coupled to the respective bit line during a read operation, and write a bit to a selected one of the memory cells coupled to the respective bit line during a write operation. The I/O circuits 515-1 to 515-N may output read bits to a circuit (not shown) accessing the memory and receive bits to be written into the memory core 510 from the circuit (not shown). Each of the I/O circuits 515-1 to 515-N is also configured to precharge the respective bit line to a precharge state (e.g., a precharge voltage) during a precharge operation.

Figure 7:
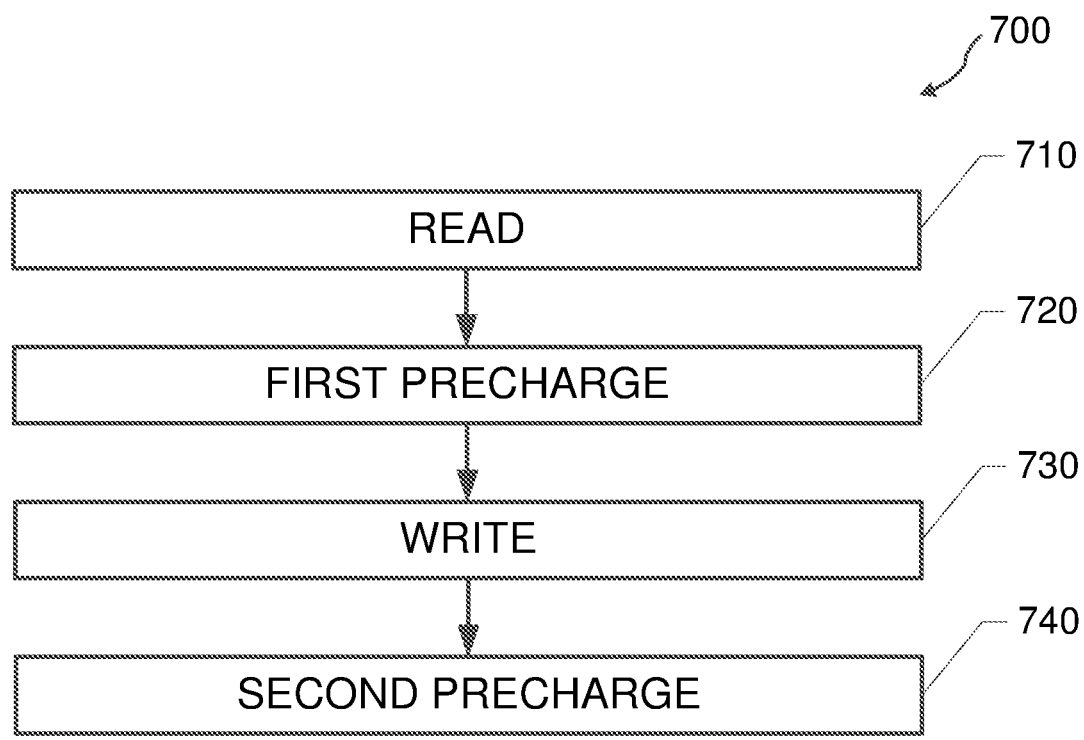
FIG. 7 illustrates an example of a read operation and a write operation during one cycle time according to certain aspects of the present disclosure.

The memory control circuit 520 controls operations of the memory, and receives the clock signal Clk for timing operations of the memory. In certain aspects, the memory control circuit 520 may control operations of the memory based on a pseudo dual port architecture where a single port is used for a read and a write in the same clock cycle to match the functionality of a dual port memory. This is accomplished by splitting a clock cycle into a first portion and a second portion, in which the memory performs a read operation in the first portion of the clock cycle and a write operation in the second portion of the clock cycle. The clock cycle corresponds to one cycle (i.e., period) of the clock signal Clk and may be equal to one cycle time. In this regard, FIG. 7 illustrates an example of a read operation and a write operation 700 that are performed in one cycle time (e.g., one clock cycle) according to aspects of the present disclosure. In this example, it is assumed that the bit lines 530-1 to 530-N have been precharged in the previous cycle time, and therefore that the bit lines 530-1 to 530-N are in the precharge state at the start of the current cycle time.

At block 710, the read operation is performed. The read operation may include the memory control circuit 520 instructing the word select circuit 540 to select one of the word lines 545-1 to 545-M (e.g., based on an address) for the read operation. Each of the I/O circuits 515-1 to 515-N may then read the bit stored in the memory cell coupled to the respective bit line and the selected word line. Each of the I/O circuits 515-1 to 515-N may output the respective read bit (e.g., to a circuit accessing the memory).

At block 720, a first precharge operation is performed. The first precharge operation may include the memory control circuit 520 sending a precharge signal to the I/O circuits 515-1 to 515-N, in which each of the I/O circuits 515-1 to 515-N precharges the respective one of the bit lines 530-1 to 530-N in response to the precharge signal. The first precharge operation may be performed to precharge the bit lines 530-1 to 530-N to the precharge state (e.g., precharge voltage) in preparation for the write operation.

At block 730, the write operation is performed. The write operation may include the memory control circuit 520 instructing the word select circuit 540 to select one of the word lines 545-1 to 545-M for the write operation. Each of the I/O circuits 515-1 to 515-N may then write a respective bit to the memory cell coupled to the respective bit line and the selected word line. The read operation and the write operation may read from and write to the same address, or read from and write to different addresses.

At block 740, a second precharge operation is performed. The second precharge operation may include the memory control circuit 520 sending the precharge signal to the I/O circuits 515-1 to 515-N, in which each of the I/O circuits 515-1 to 515-N precharges the respective one of the bit lines 530-1 to 530-N in response to the precharge signal. In this example, the second precharge operation is performed to precharge the bit lines 530-1 to 530-N to the precharge state (e.g., precharge voltage) in preparation for the read operation in the next cycle time. The second precharge operation may be completed when all of the bit lines 530-1 to 530-N have been precharged to the precharge state.

The exemplary read operation and write operation 700 discussed above with reference to FIG. 7 may be performed for each one of multiple cycle times.

In this example, the event indicated by the event signal 318 sent to the blocking gate 330 may be completion of the second precharge operation. This is because the bit lines 530-1 to 530-N need to be precharged in the second precharge operation before the end of the current cycle time in order to prepare the bit lines 530-1 to 530-N for the read operation in the next cycle time. Since the read operation, the first precharge operation, and the write operation precede the second precharge operation in this example, indication of completion of the second precharge operation by the event signal 318 inherently indicates that the read operation, the first precharge operation, and the write operation have been completed.

In this example, the event signal 318 disables the blocking gate 330 during the current cycle time when the second precharge operation has been completed. Thus, in this example, the input test signal Tdi propagates to the output 314 of the circuit 310 during the current cycle time when the memory is able to complete the second precharge operation by the end of the current cycle time. The input test signal Tdi is blocked from the output 314 of the circuit 310 during the current cycle time when the memory not able to complete the second precharge operation by the end of the current cycle time. Therefore, in this example, the determination by the test processor 360 of whether the memory is able to operate at a particular frequency and voltage depends on whether the memory is able to complete the second precharge operation within a cycle time.

Figure 8:
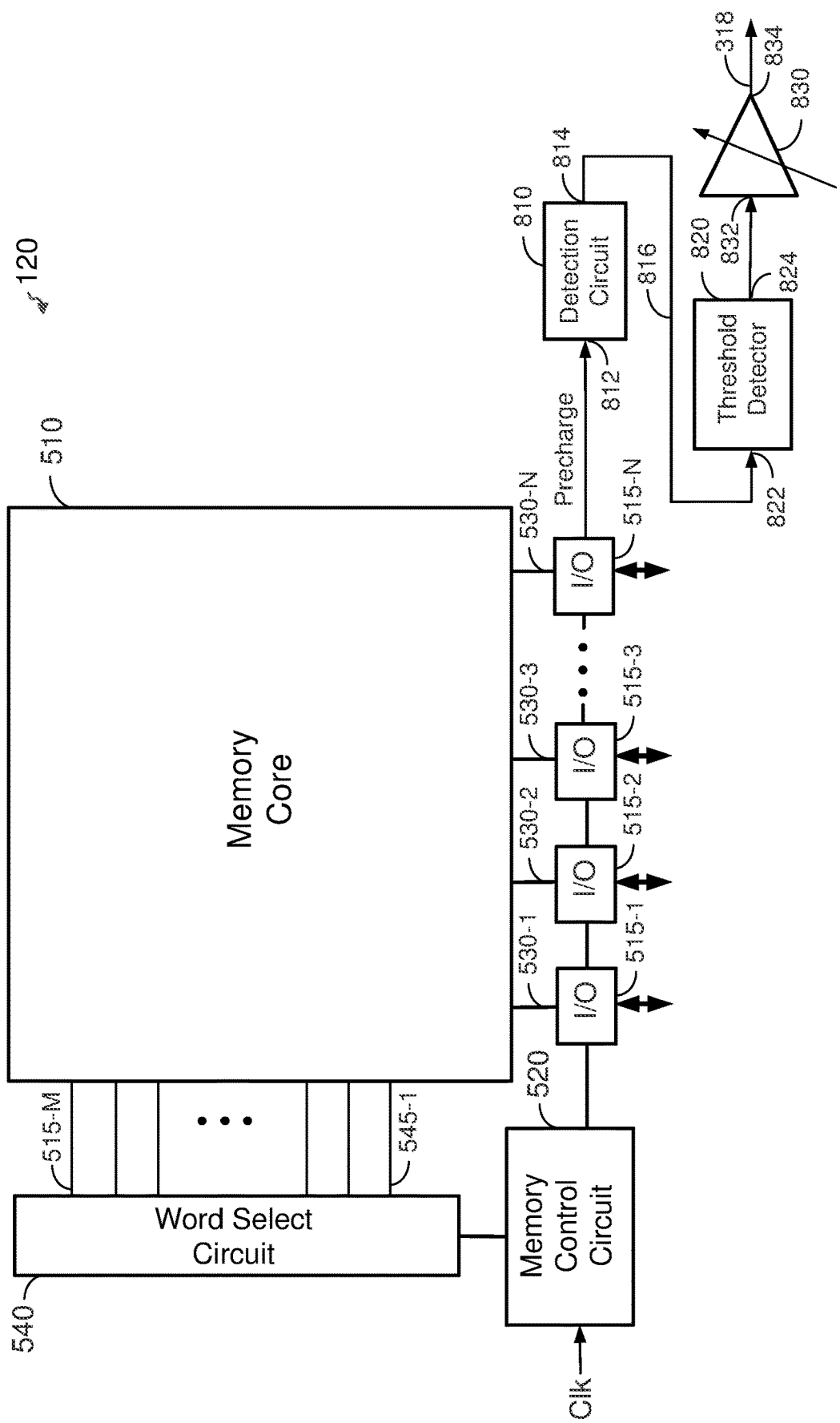
FIG. 8 shows an exemplary implementation for detecting a precharge operation in a memory according to certain aspects of the present disclosure.

FIG. 8 shows an exemplary implementation for generating the event signal 318 according to aspects of the present disclosure. In this example, the event signal 318 indicates completion of the second precharge operation discussed above, although it is to be appreciated that the present disclosure is not limited to this example. In this example, the circuit block 120 includes a detection circuit 810, a replica bit line 816, a threshold detector 820, and a variable delay element 830. The replica bit line 816 may be implemented with a line having a capacitive load that approximates the capacitive load of one of the bit lines 530-1 to 530-N in the memory core 510.

The detection circuit 810 has an input 812 configured to receive the precharge signal and an output 814. In this regard, the input 812 of the detection circuit 810 may be coupled to a precharge line that carries the precharge signal from the memory control circuit 520 to one or more of the I/O circuits 515-1 to 515-N. In one aspect, the input 812 may be coupled to the precharge line such that the input 812 receives the precharge signal at approximately the same time as the last I/O circuit (e.g., I/O circuit 515-N) to receive the precharge signal. The output 814 of the detection circuit 810 is coupled to the replica bit line 816.

The detection circuit 810 receives the precharge signal twice in one cycle time (e.g., one clock cycle). This is because the memory control circuit 520 sends the precharge signal once for the first precharge operation and again for the second precharge operation. During a cycle time, the detection circuit 810 is configured to isolate the second instance of the precharge signal during the cycle time since the second instance of the precharge signal corresponds to the second precharge operation. In one example, the detection circuit 810 may detect the start of the second precharge operation (e.g., by detecting an edge of the second instance of the precharge signal during the cycle time) and precharge the replica bit line 816 in response to detecting the start of the second precharge operation (e.g., the edge of the second instance of the precharge signal). In this example, the precharging of the replica bit line 816 is used to mimic the precharging of the last one of the bit lines 530-1 to 530-N.

The threshold detector 820 has an input 822 coupled to the replica bit line 816, and an output 824. During a cycle time, the threshold detector 820 detects (i.e., senses) a voltage of the replica bit line 816. The threshold detector 820 is configured to generate the event signal 318 based on the detected voltage of the replica bit line 816. For example, the threshold detector 820 may set the event signal 318 to the first logic value (which indicates occurrence of the event) when the detected voltage is equal to or above a voltage threshold, and set the event signal 318 to the second logic value when the detected voltage is below the voltage threshold. In this example, when the voltage of the replica bit line 816 reaches the voltage threshold during precharging, the threshold detector 820 transitions the event signal 318 from the second logic value to the first logic value to indicate occurrence of the event. In one example, the voltage threshold may be chosen such that the threshold detector 820 transitions the event signal 318 to the first logic value when the replica bit line 816 precharges to the precharge voltage.

In this example, the time it takes for the replica bit line 816 to precharge to the precharge voltage is similar to the time it takes for the last bit line (e.g., bit line 530-N) in the memory core 510 to precharge to the precharge voltage.

The delay element 830 has an input 832 coupled to the output 824 of the threshold detector 820, and an output 834 coupled to the control input 336 of the blocking gate 330 (shown in FIG. 3). The delay element 830 is configured to delay the event signal 318 from the threshold detector 820 by a variable time delay to add a time margin to the event signal 318. The time margin may be added to the event signal 318 to account for variations between the time the last bit line in the memory core 510 is precharged and the time the replica bit line 816 is precharged. In some implementations, the delay element 830 may be omitted (e.g., for cases where the time margin is not needed).

Figure 9:
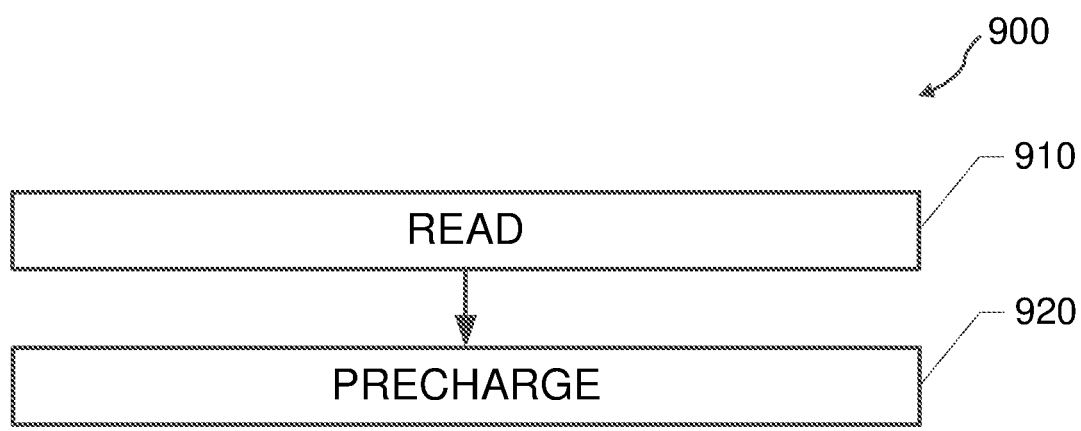
FIG. 9 illustrates an example of a read operation during one cycle time according to aspects of the present disclosure.

Although the event indicated by the event signal 318 for the memory in the above example is a second precharge operation, it is to be appreciated that aspects of the present disclosure are not limited to this example. In other implementations, the memory may perform a read operation or a write operation in one cycle time, but not both in the same cycle time. In this regard, FIG. 9A illustrates an example of a read operation that may be performed in one cycle time according to aspects of the present disclosure. In this example, it is assumed that the bit lines 530-1 to 530-N have been precharged in the previous cycle time, and therefore that the bit lines 530-1 to 530-N are in the precharge state at the start of the current cycle time.

At block 910, the read operation is performed. The read operation may include the memory control circuit 520 instructing the word select circuit 540 to select one of the word lines 545-1 to 545-M (e.g., based on an address) for the read operation. Each of the I/O circuits 515-1 to 515-N may then read the bit stored in the memory cell coupled to the respective bit line and the selected word line. Each of the I/O circuits 515-1 to 515-N may output the respective read bit (e.g., to a circuit accessing the memory).

At block 920, a precharge operation is performed. The precharge operation may include the memory control circuit 520 sending a precharge signal to the I/O circuits 515-1 to 515-N, in which each of the I/O circuits 515-1 to 515-N precharges the respective one of the bit lines 530-1 to 530-N in response to the precharge signal. In this example, the precharge operation is performed to precharge the bit lines 530-1 to 530-N to the precharge state (e.g., precharge voltage) in preparation for a read operation or a write operation in the next cycle time. The precharge operation may be completed when all of the bit lines 530-1 to 530-N have been precharged to the precharge state.

In this example, the detection circuit 810 may detect the start of the precharge operation after the read operation (e.g., by detecting an edge of the precharge signal) and precharge the replica bit line 816 in response to detecting the start of the precharge operation (e.g., the edge of the precharge signal). In this example, the detection circuit 810 does not need to isolate a second instance of the precharge signal since the precharge operation is performed once during the cycle time. Thus, in this example, the event indicated by the event signal 318 is completion of the precharge operation at block 920.

Figure 10:
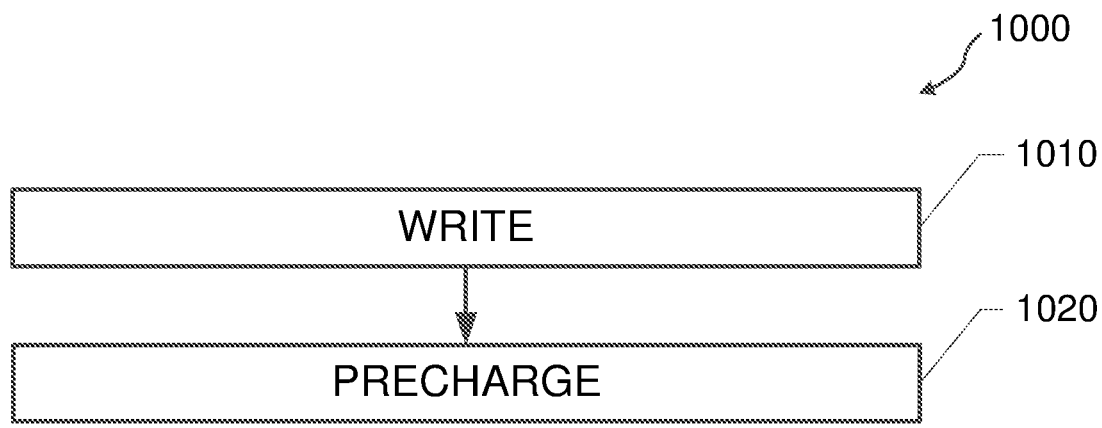
FIG. 10 illustrates an example of a write operation during one cycle time according to aspects of the present disclosure.

FIG. 10 illustrates an example of a write operation that may be performed in one cycle time according to aspects of the present disclosure. In this example, it is assumed that the bit lines 530-1 to 530-N have been precharged in the previous cycle time, and therefore that the bit lines 530-1 to 530-N are in the precharge state at the start of the current cycle time.

At block 1010, the write operation is performed. The write operation may include the memory control circuit 520 instructing the word select circuit 540 to select one of the word lines 545-1 to 545-M (e.g., based on an address) for the write operation. Each of the I/O circuits 515-1 to 515-N may then write a respective bit to the memory cell coupled to the respective bit line and the selected word line.

At block 1020, a precharge operation is performed. The precharge operation may include the memory control circuit 520 sending a precharge signal to the I/O circuits 515-1 to 515-N, in which each of the I/O circuits 515-1 to 515-N precharges the respective one of the bit lines 530-1 to 530-N in response to the precharge signal. In this example, the precharge operation is performed to precharge the bit lines 530-1 to 530-N to the precharge state (e.g., precharge voltage) in preparation for a read operation or a write operation in the next cycle time. The precharge operation may be completed when all of the bit lines 530-1 to 530-N have been precharged to the precharge state.

In this example, the detection circuit 810 may detect the start of the precharge operation after the write operation (e.g., by detecting an edge of the precharge signal) and precharge the replica bit line 816 in response to detecting the start of the precharge operation (e.g., the edge of the precharge signal). In this example, the detection circuit 810 does not need to isolate a second instance of the precharge signal since the percharge operation is performed once during the cycle time. Thus, in this example, the event indicated by the event signal 318 is completion of the precharge operation at block 1020.

It is to be appreciated that the event indicated by the event signal 318 is not limited to a precharge operation. For example, in other implementations, the event may be the opening of input latches to store address/data for the next cycle time, reset of a self-time loop, or another event.

For example, the memory may be a self-timed memory. In this example, the memory includes a self-timing circuit that times the operations for a cycle time according to a self-time loop. The self-time loop may be triggered by an edge (e.g., a rising edge) of the clock signal Clk. The self-time loop may time the operations for the current cycle time so that the operations are performed in the proper sequence. For example, for the example illustrated in FIG. 8, the self-time loop may time the start of the first precharge operation after the read operation, time the start of the write operation after the first precharge operation, etc. The self-timing circuit may reset the self-time loop for the next cycle time when the self-time loop is complete. In this regard, the self-timing circuit may generate a self-time loop reset signal indicating that the self-time loop for the current cycle time is complete. In this example, the self-time loop reset signal may be used for the event signal 318. Thus, in this example, the event indicated by the event signal 318 may be reset of the self-time loop (i.e., the blocking gate 330 may be disabled on reset of the self-time loop).

Figure 11:
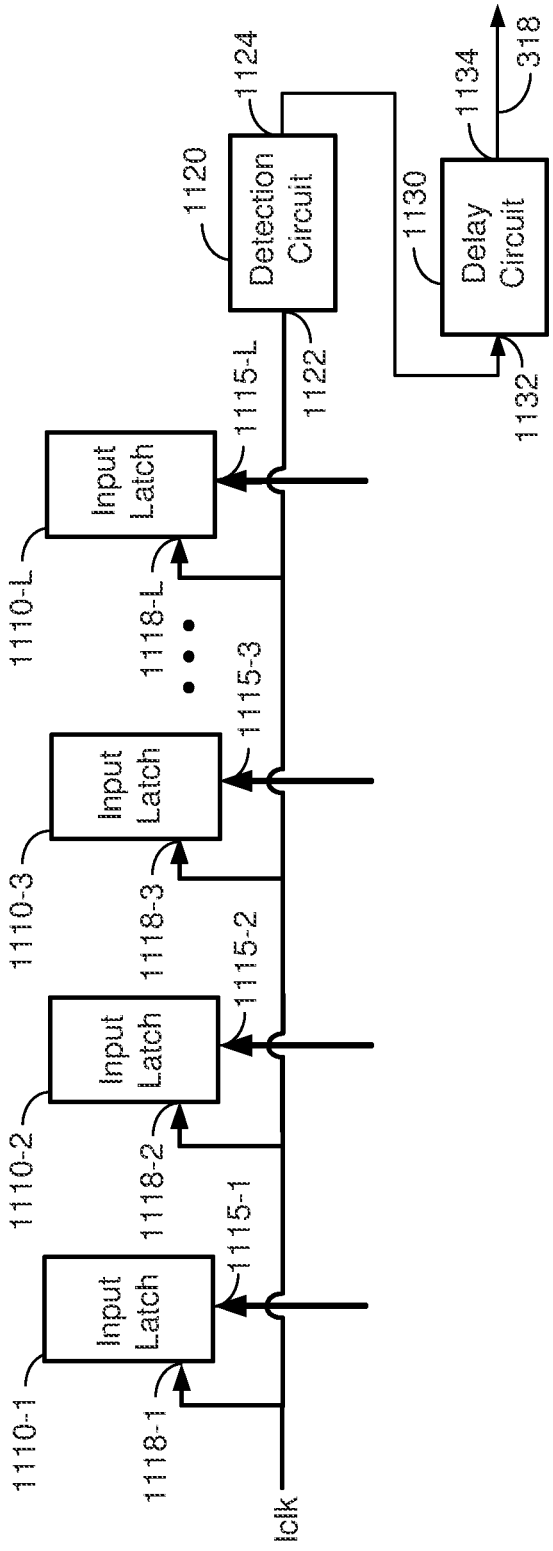
FIG. 11 shows an example of input latches for a memory according to certain aspects of the present disclosure.
Figure 12:
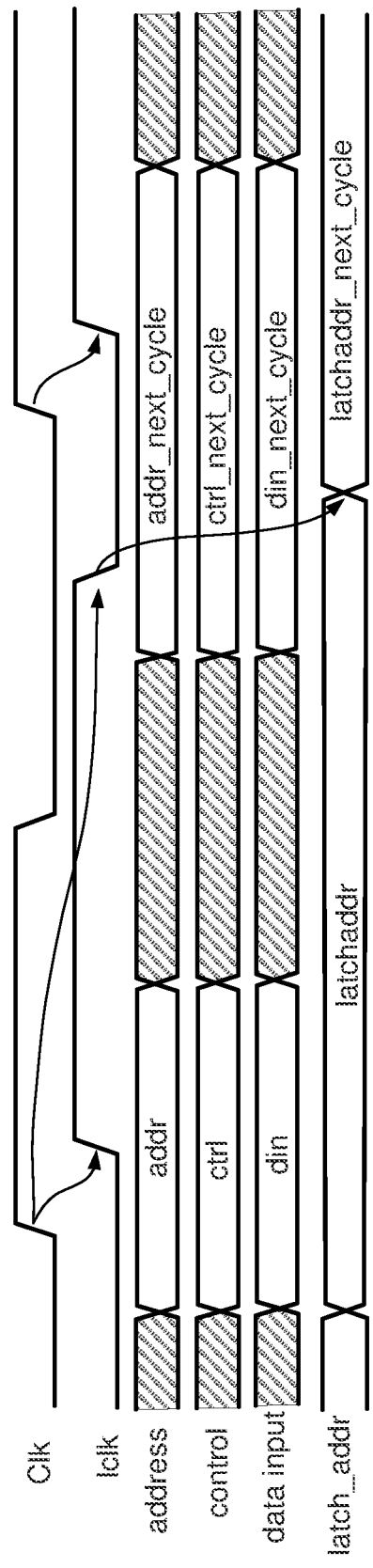
FIG. 12 shows an exemplary timing diagram for the input latches according to certain aspects of the present disclosure.

In another example, the memory includes multiple input latches 1110-1 to 1110-L shown in FIG. 11 for latching address/control/data signals. The input latches 1110-1 to 1110-L may be included in the I/O circuits 515-1 to 515-N, the word select circuit 540 and/or the memory control circuit 520 shown in FIG. 5. Each of the input latches 1110-1 to 1110-L has a respective clock input 1118-1 to 1118-L. In the example in FIG. 11, the clock input 1118-1 to 1118-L of each of the input latches 1110-1 to 1110-L receives a latch clock signal lclk, which may be generated by the memory control circuit 520 based on the clock signal Clk. Thus, the input latches 1110-1 to 1110-L are clocked using the latch clock signal lclk. FIG. 12 shows an exemplary timing diagram of the clock signal Clk and the latch clock signal lclk according to certain aspects.

Referring back to FIG. 11, each of the input latches 1110-1 to 1110-L also has a respective signal input 1115-1 to 1115-L for receiving an address signal, a control signal or an input data signal. In this example, each of the input latches 1110-1 to 1110-L is a level-based latch in which the respective input latch 1110-1 to 1110-L is closed when the latch clock signal lclk is high, and open (i.e., transparent) when the latch clock signal lckl is low, or vice versa.

FIG. 12 shows an exemplary timing diagram of the address signal, the control signal, and the input data signal according to certain aspects. In this example, the input latches 1110-1 to 1110-L are open when the latch clock signal lclk is low. In the example in FIG. 12, the latch clock signal lclk transitions from high to low within the current cycle time. At this point, the input latches 1110-1 to 1110-L are open, and the address signal, the control signal, and the input data signal for the next cycle time (labeled "addr_next_cycle", "cltr_next_cycle", "din_next_cycle") enter the input latches 1110-1 to 1110-L. After a short delay, the address signal, the control signal, and the input data signal for the next cycle time are latched or stored in the memory for the next cycle time. In FIG. 12, the latched address signal for the next cycle time is labeled "latchaddr_next_cycle". The timing for the latched control signal and latched input data signal for the next cycle time may be similar to the latched address signal. At this point, the memory is ready for the input latches 1110-1 to 1110-L to close during the next cycle time.

In this example, the event indicated by the event signal 318 may be that the address/control/data for the next cycle time are latched in the memory. In this example, the circuit block 120 includes a detection circuit 1120 having an input 1122 and an output 1124, and a delay circuit 1130 having an input 1132 coupled to the output 1124 of the detection circuit 1120, and an output 1134 coupled to the control input 336 of the blocking gate 330. The input 1122 of the detection circuit 1120 is configured to receive the latch clock signal lclk. In this example, the detection circuit 1120 may detect the opening of the input latches 1110-1 to 1110-L by detecting an edge of the latch clock signal lclk. For the example in which the input latches 1110-1 to 1110-L are open when the latch clock signal lclk is low, the detection circuit 1120 may detect the opening of the input latches 1110-1 to 1110-L by detecting a falling edge of the latch clock signal lckl. For the example in which the input latches 1110-1 to 1110-L are open when the latch clock signal lclk is high, the detection circuit 1120 may detect the opening of the input latches 1110-1 to 1110-L by detecting a rising edge of the latch clock signal lckl.

In response to detecting the edge of the latch clock signal lclk, the detection circuit 1120 generates a detection signal, which is output to the delay circuit 1130. The delay circuit 1130 delays the detection signal by a time delay to generate the event signal 318, and outputs the delayed detection signal as the event signal 318 at the output 1134. In this example, the detection signal may be set to the first logic value indicating occurrence of the event. The time delay may be approximately equal to the delay between the time the input latches 1110-1 to 1110-L open to receive the address signal, the control signal and the data signal for the next cycle time and the time that the address signal, the control signal and the data signal for the next cycle time are latched or stored in the memory. In this regard, the delay circuit 1130 may include logic that mimics latch/storage delays in the memory. In this example, the detection circuit 1120 may output the second logic value before detection of the edge of the latch clock signal lclk.

Figure 13:
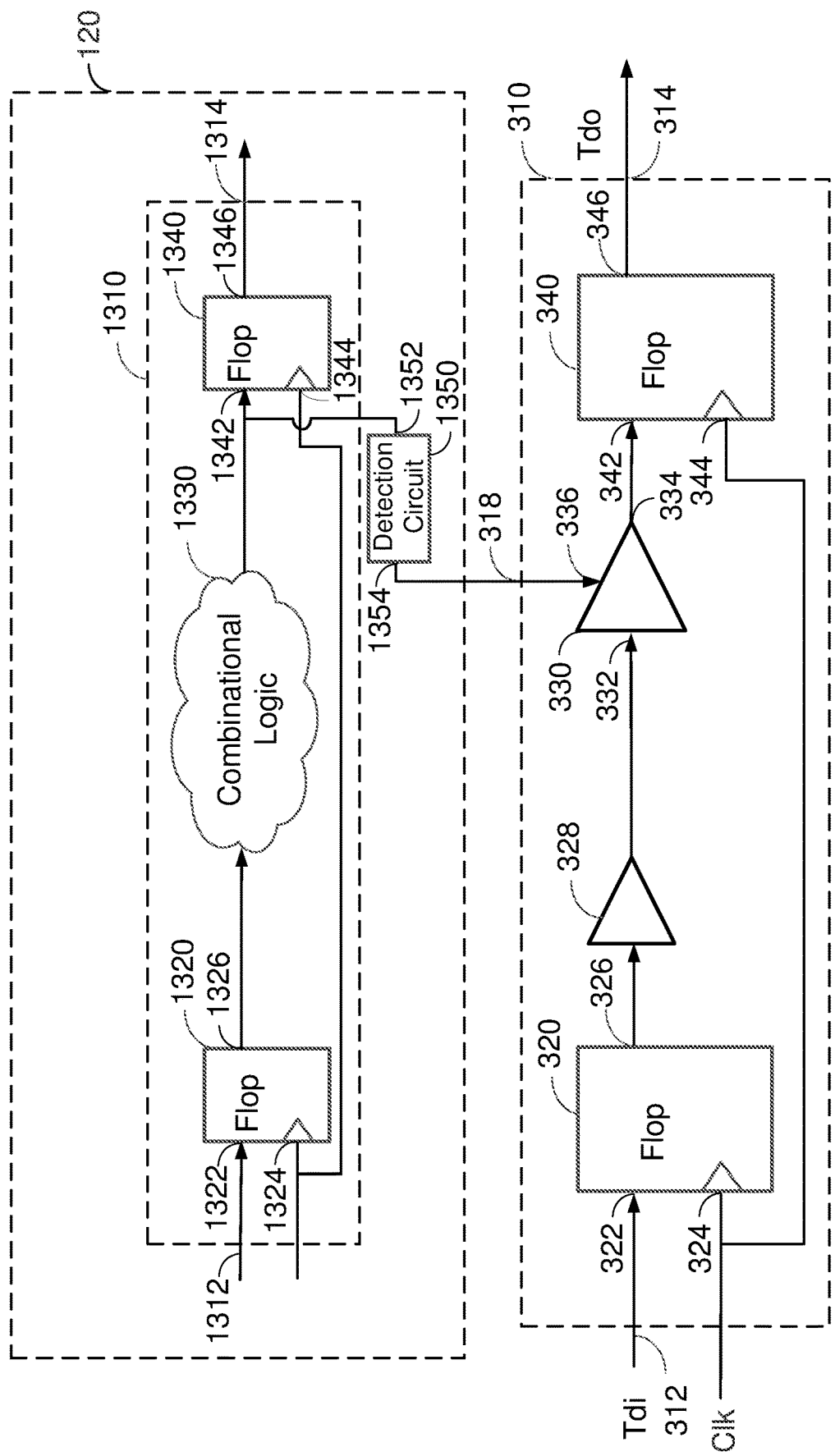
FIG. 13 shows an example of a signal path in a circuit block according to aspects of the present disclosure.

FIG. 13 shows another example of the circuit block 120 in which the circuit block 120 includes a signal path 1310. The signal path 1310 may be one of multiple signal paths (not shown) in the circuit block 120. In this example, the signal path 1310 may be a critical signal path that limits the minimum voltage at which the circuit block 120 can operate for a given frequency. In one example, the critical signal path in the circuit block 120 may be identified for a given design by performing a timing analysis on the circuit block 120. In this example, the critical signal path may be identified by the path with the smallest timing margin and/or based on another parameter.

In the example in FIG. 13, the signal path 1310 includes a first flop 1320, combinational logic 1330, and a second flop 1340. The first flop 1320 and the second flop 1340 may be configured to latch data at different points in the signal path 1310, and may be clocked using the clock signal Clk, or a clock signal generated from the clock signal Clk.

The first flop 1320 has a data input 1322, a clock input 1324, and an output 1326. In one example, the clock input 1324 receives the clock signal Clk. In this example, the first flop 1320 is configured to latch the logic value at the data input 1322 on a rising edge of the clock signal Clk, and output the latched logic value at the output 1326. In the example shown in FIG. 13, the data input 1322 of the first flop 1320 is coupled to an input 1312 of the signal path 1310, which receives an input data signal. The output 1326 of the first flop 1320 is coupled to the combinational logic 1330.

The combinational logic 1330 receives the latched logic values of the data signal from output 1326 of the first flop 1320 and processes the latched logic values of the data signal. The processing performed by the combinational logic 1330 may depend, for example, on a type of processor (e.g., CPU, GPU, etc.) implemented by the circuit block 120.

The second flop 1340 has a data input 1342, a clock input 1344, and an output 1346. In one example, the clock input 1344 receives the clock signal Clk. In this example, the second flop 1340 is configured to latch the logic value at the data input 1342 on a rising edge of the clock signal Clk, and output the latched logic value at the output 1346. In the example shown in FIG. 13, the combinational logic 1330 is coupled between the output 1326 of the first flop 1320 and the data input 1342 of the second flop 1340. The output 1346 of the second flop 1340 is coupled to an output 1314 of the signal path 1310.

In this example, when the first flop 1320 outputs a latched logic value of the data signal to the combinational logic 1330 on a rising edge of the clock signal Clk, the combinational logic 1330 may process the latched logic value into a processed data value that needs to arrive at the data input 1342 of the second flop 1340 by the rising edge of the next cycle of the clock signal Clk in order for the second flop 1340 to latch (i.e., capture) the processed data value. The processed data value may be a logic value.

In this example, the event indicated by the event signal 318 may be the arrival of the processed data value at the data input 1342 of the second flop 1340. In this regard, the circuit block 120 may include a detection circuit 1350 configured to detect the processed data value at the data input 1342 of the second flop 1340. In the example in FIG. 13, the detection circuit 1350 has an input 1352 coupled to the data input 1342 of the second flop 1340, and an output 1354 coupled to the control input 336 of the blocking gate 330. In this example, the detection circuit 1350 is configured to detect the processed data value at the data input 1342 of the second flop 1340. Upon detection of the processed data value, the detection circuit 1350 outputs a detection signal at the output 1354, which provides the event signal 318 to the control input 336 of the blocking gate 330. In this example, the detection signal may have the first logic value indicating occurrence of the event (e.g., arrival of the processed data value at the data input 1342 of the second flop 1340).

In this example, the event signal 318 disables the blocking gate 330 during the current cycle time when the processed data value from the combinational logic 1330 for the current cycle time reaches the data input 1342 of the second flop 940 in the signal path 1310. Thus, in this example, the input test signal Tdi propagates to the output 314 of the circuit 310 during the current cycle time when the processed data value reaches the data input 1342 of the second flop 1340 by the end of the current cycle time. The input test signal Tdi is blocked from the output 314 of the circuit 310 during the current cycle time when the processed data value does not reach the data input 1342 of the second flop 1340 by the end of the current cycle time. Therefore, in this example, the determination by the test processor 360 of whether the circuit block 120 is able to operate at a particular frequency and voltage depends on whether the processed data value for the current cycle time reaches the data input 1342 of the second flop 1340 in the signal path 1310 by the end of the current cycle time.

In the above examples, the event signal 318 indicates an event that is indicative of proper operation of the circuit block 120 (e.g., completion of a precharge operation before the end of a cycle time, etc.). However, it is to be appreciated that the present disclosure is not limited to these examples. In other implementations, the event signal 318 may indicate an event that is indicative of improper operation of the circuit block 120. For example, the event may include an interrupt signal indicating that an error or failure has occurred in the circuit block 120. In this example, the blocking gate 330 may be enabled when the event signal 318 indicates occurrence of the event since the event is indicative of improper operation in this example. Also, the blocking gate 330 may be disabled when the event signal 318 does not indicate occurrence of the event. In this example, when the event (e.g., interrupt signal) occurs within the cycle time, the blocking gate 330 is enabled by the event signal 318 and blocks the input test signal Tdi. In this case, the output test signal Tdo does not reflect the input test signal Tdi, and the test processor 360 determines that the circuit block 120 is not operating properly. When the event does not occur within the cycle time, the blocking gate is disabled and passes the input test signal Tdi. In this case, the output test signal Tdo reflects the input test signal Tdi, and the test processor 360 determines that the circuit block 120 is operating properly.

In general, the blocking gate 330 either blocks the input test signal Tdi (i.e., blocks the output 326 of the first flop 326 from the data input 342 of the second flop 340) or passes the input test signal Tdi (i.e., couples the output 326 of the first flop 326 to the data input 342 of the second flop 340) based on the event signal 318. Whether the blocking gate 330 is enabled or disabled when the event indicated by the event signal 318 occurs depends on the type of event. For events indicative of proper operation of the circuit block 120 (e.g., completion of a precharge operation before the end of a cycle time, etc.), the blocking gate 330 is disabled when the event occurs. For events indicative of improper operation of the circuit block 120 (e.g., an interrupt signal), the blocking gate 330 is enabled when the event occurs.

Figure 14:
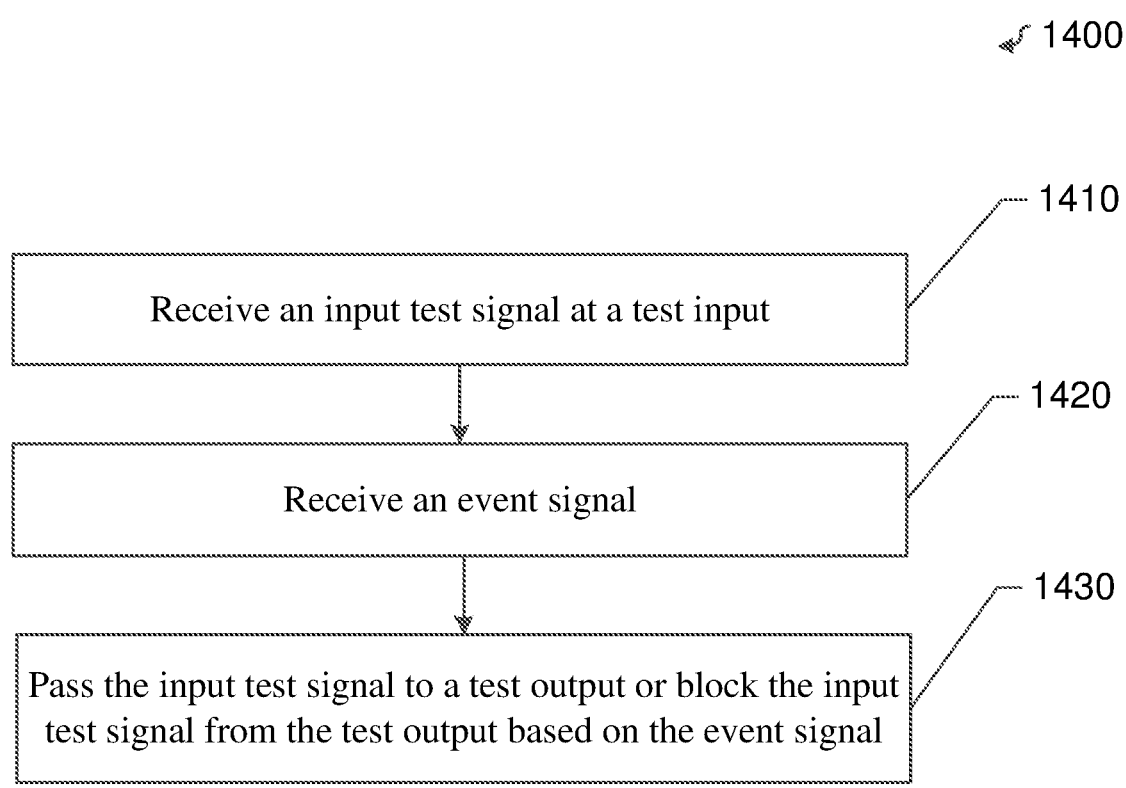
FIG. 14 is a flowchart illustrating a method according to certain aspects of the present disclosure.

FIG. 14 is a flowchart illustrating a method 1400 according to certain aspects of the present disclosure. The method 1400 may be performed by the circuit 310.

At block 1410, an input test signal is received at a test input. The input test signal may correspond to the input test signal Tdi and the test input may correspond to the input 312 of the circuit 310.

At block 1420, an event signal is received. The event signal may correspond to the event signal 318 and may indicate an occurrence of an event in a circuit block (e.g., circuit block 120). The event may include a precharge operation, opening of input latches, reset of a self-time loop, arrival of a data value at a flop in a signal path, an interrupt signal indicating an error or failure in the circuit block, or another type of event.

At block 1430, the input test signal is passed to a test output or the input test signal is blocked from the test output based on the event signal. The test output may correspond to the output 314 of the circuit 310. In one example, the input test signal is passed to the test output when the event signal indicates an occurrence of an event in a circuit block and blocked from the test output when the event signal does not indicate the occurrence of the event. In this example, the event may include a precharge operation, opening of input latches, reset of a self-time loop, arrival of a data value at a flop in a signal path, or another type of event. In another example, the input test signal is blocked from the test output when the event signal indicates an occurrence of an event in a circuit block and passed to the test output when the event signal does not indicate the occurrence of the event. In this example, the event may include an interrupt signal indicating an error or a failure in the circuit block, or another type of event.

The method 1400 may be performed to determine whether the circuit block is able to operate properly at a certain frequency and voltage. For example, a test processor (e.g., test processor 360) may determine that the circuit block operates properly when the input test signal is passed to the test output, in which case the output test signal (e.g., output test signal Tdo) at the test output (e.g., output 314) reflects the input test signal. The test processor 360 may determine that the circuit block fails to operate properly when the input test signal is blocked from the test output, in which case the output test signal (e.g., output test signal Tdo) at the test output (e.g., output 314) does not reflect the input test signal.

It is to be appreciated that the present disclosure is not limited to the exemplary terminology used above to describe aspects of the present disclosure. For example, the circuit block 120 may also be referred to as a functional block, a subsystem, or another term. In another example, an operation may also be referred to as a task or another term. The word select circuit 540 may also be referred to as a word decoder or another term. The replica bit line 816 may also be referred to as a dummy bit line or another term. A flop may also be referred to as a flip-flop, an edge-triggered latch, or another term.

Further, although aspects of the first flop 320 and the second flop 340 were discussed above using the example in which the first flop 320 and the second flop 340 are implemented with rising-edge triggered flops, it is to be appreciated that the present disclosure is not limited to this example, and that the first flop 320 and the second flop 340 may alternatively be implemented with falling-edge triggered flops.

Also, it is to be appreciated that the blocking gate 330 may be implemented with a pass gate. In this example, the blocking gate 330 may be disabled by enabling the pass gate since the pass gate passes a signal when the pass gate is enabled, and the blocking gate 330 may be enabled by disabling the pass gate since the pass gate blocks a signal when the pass gate is disabled.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
    a first flop having a data input, a clock input, and an output, wherein the clock input of the first flop is configured to receive a clock signal;
    a blocking gate having a signal input, a control input, and an output, wherein the signal input is coupled to the output of the first flop; and
    a second flop having a data input, a clock input, and an output, wherein the data input of the second flop is coupled to the output of the blocking gate, and the clock input of the second flop is configured to receive the clock signal;
    wherein the blocking gate is configured to:
    receive an event signal at the control input, wherein the event signal indicates an occurrence of an event in a memory, and wherein the event is one of a precharge operation in the memory, opening of input latches in the memory, reset of a self-time loop in the memory, and an error in the memory; and
    couple the output of the first flop to the data input of the second flop or block the output of the first flop from the data input of the second flop based on the event signal.

2. The apparatus of claim 1, wherein the event is the precharge operation in the memory, and the blocking gate is configured to:
    couple the output of the first flop to the data input of the second flop when the event signal indicates an occurrence of the event in the memory; and
    block the output of the first flop from the data input of the second flop when the event signal does not indicate the occurrence of the event.

3. The apparatus of claim 2, further comprising:
a replica bit line;
a detection circuit configured to:
detect a precharge signal in the memory; and
precharge the replica bit line in response to detecting the precharge signal; and
a threshold detector coupled to the replica bit line, wherein the threshold detector is configured to:
detect a voltage of the replica bit line; and
generate the event signal based on the detected voltage.

4. The apparatus of claim 3, wherein the threshold detector is configured to:
compare the detected voltage of the replica bit line with a threshold; and
set the event signal to a logic value indicating the occurrence of the event when the detected voltage is equal to or above the threshold.

5. The apparatus of claim 3, wherein the detection circuit receives the precharge signal twice in a clock cycle, and the detection circuit is configured to detect a second instance of the precharge signal in the clock cycle.

6. The apparatus of claim 3, further comprising a delay element coupled between the threshold detector and the control input of the blocking gate.

7. The apparatus of claim 2, wherein the event comprises an arrival of a data value at an input of a flop in a signal path of the memory.

8. The apparatus of claim 1, wherein the event is the opening of the input latches in the memory, and the input latches are clocked using a latch clock signal, and the apparatus further comprises:
a detection circuit configured to:
detect an edge of the latch clock signal; and
output a detection signal in response to detecting the edge of the latch clock signal; and
a delay circuit coupled between the detection circuit and the control input of the blocking gate, wherein the delay circuit is configured to delay the detection signal by a time delay to generate the event signal.

9. The apparatus of claim 8, wherein the time delay is approximately equal to a delay between a time that at least one of a data signal, an address signal and a control signal enter the input latches and a time that the at least one of the data signal, the address signal and the control signal are latched in the memory.

10. The apparatus of claim 1, wherein the event is the error in the memory, and the blocking gate is configured to:
block the output of the first flop from the data input of the second flop when the event signal indicates the occurrence of the event in the memory; and
couple the output of the first flop to the data input of the second flop when the event signal does not indicate the occurrence of the event in the memory.

* * * * *